(12) United States Patent
Gizdarski et al.

(10) Patent No.: US 10,908,213 B1
(45) Date of Patent: Feb. 2, 2021

(54) REDUCING X-MASKING EFFECT FOR LINEAR TIME COMPACTORS

(71) Applicant: Synopsys, Inc., Mountain View, CA (US)

(72) Inventors: Emil Gizdarski, Cupertino, CA (US); Peter Wohl, Williston, VT (US); John A. Waicukauski, Tualatin, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/586,652

(22) Filed: Sep. 27, 2019

Related U.S. Application Data

(60) Provisional application No. 62/738,183, filed on Sep. 28, 2018.

(51) Int. Cl.
  *G01R 31/28* (2006.01)
  *G01R 31/3185* (2006.01)

(52) U.S. Cl.
  CPC ........... *G01R 31/318536* (2013.01); *G01R 31/318547* (2013.01); *G01R 31/318572* (2013.01); *G01R 31/318591* (2013.01)

(58) Field of Classification Search
  None
  See application file for complete search history.

(56) References Cited

U.S. PATENT DOCUMENTS

| | | | |
|---|---|---|---|
| 6,557,129 B1 | 4/2003 | Rajski et al. | |
| 7,840,865 B2 * | 11/2010 | Lai | G01R 31/318547 714/728 |
| 8,103,926 B2 | 1/2012 | Gizdarski | |
| 2005/0060625 A1 | 3/2005 | Wang et al. | |
| 2005/0097418 A1 * | 5/2005 | Anzou | G01R 31/318555 714/733 |
| 2007/0234157 A1 * | 10/2007 | Rajski | G01R 31/318563 714/728 |
| 2007/0234619 A1 | 10/2007 | Rajski et al. | |
| 2007/0273401 A1 * | 11/2007 | Kiryu | G01R 31/318572 326/16 |
| 2008/0195346 A1 | 8/2008 | Lin et al. | |

(Continued)

OTHER PUBLICATIONS

Barnhart, Carl et al., "OPMISR: The Foundation for Compressed ATP Vectors", ITC International Test Conference, 2001 IEEE, Paper 27.4, pp. 748-757 (10 pages).

(Continued)

*Primary Examiner* — Mujtaba M Chaudry
(74) *Attorney, Agent, or Firm* — Bever, Hoffman & Harms, LLP

(57) ABSTRACT

A proposed linear time compactor (LTC) with a means of significantly reducing the X-masking effect for designs with X's and supports high levels of test data compression where:

1) The LTC consists of two parts that are unloaded into a tester through an output serializer.
2) The first part is unloaded per t shift cycles while the second part is unloaded once per test pattern.
3) One part of the LTC divides scan chains into groups such that X-masking effect between groups of scan chains is impossible.
4) One part of LTC divides shift cycles into groups such that X-masking effect between groups of shift cycles is impossible.

Consequently, the X-masking effect in the proposed LTC is significantly reduced.

51 Claims, 20 Drawing Sheets

(56) References Cited

U.S. PATENT DOCUMENTS

| | | | | |
|---|---|---|---|---|
| 2008/0235544 | A1* | 9/2008 | Lai | G01R 31/318547 714/729 |
| 2010/0257417 | A1* | 10/2010 | Rajski | G01R 31/318566 714/731 |
| 2015/0153410 | A1* | 6/2015 | Lin | G01R 31/318536 714/727 |
| 2016/0377677 | A1* | 12/2016 | Tille | G01R 31/318566 714/727 |

OTHER PUBLICATIONS

Chandra, Anshuman et al., "Scalable Adaptive Scan (SAS)", 2009 EDAA, 6 pages.

Chao, Mango C.-T., et al., "Response Shaper: A Novel Technique to Enhance Unknown Tolerance for Output Response Compaction", 2005 IEEE, 8 pages.

Gizdarski, Emil et al., "A New Paradigm for Synthesis of Linear Decompressors", DAC Jun. 18, 2017, 6 pages.

Gizdarski, Emil, "Constructing Augmented Time Compactors", 2010 IEEE, 6 pages.

Gizdarski, Emil, "Two-Step Dynamic Encoding for Linear Decompressors", 2014 IEEE 23rd Asian Test Symposium, 6 pages.

Mitra, Subhasish, "X-Compact: An Efficient Response Compaction Technique", IEEE Transactions on Computer-Aided Design of Integrated Circuits and Systems, vol. 23, No. 3, Mar. 2004, 12 pages.

Rajski, Janusz et al., "Finite Memory Test Response Compactors for Embedded Test Applications", IEEE Transactions on Computer-Aided Design of Integrated Circuits and Systems, vol. 24, No. 4, Apr. 2005, 13 pages.

Rajski, Janusz et al., "Synthesis of X-Tolerant Convolutional Compactors", Proceedings of the 23rd IEEE VLSI Test Symposium (2005), 6 pages.

Savir, J. et al., "Identification of Failing Tests With Cycling Registers", 1988 Int'l. Test Conference, Paper 19.2, 7 pages.

Sharma, Manish et al., "X-filter: Filtering unknowns from compacted test responses", Int'l Test Conference, Paper 42.1, 2005 IEEE, 9 pages.

Sinanoglu, Ozgur, et al., "X-Align: Improving the Scan Cell Observability of Response Compactors", IEEE Transactions on Very Large Scale Integration (VLSI) Systems, vol. 17, No. 10, Oct. 2009, 13 pages.

* cited by examiner

| Config. | #designs | #chains | Len. of chains | Len. Of LTC | Comp. ratio | #test response bits | Cycles per pattern |
|---|---|---|---|---|---|---|---|
| C1 | 1 | 228 | 286 | 88 | 92 | 660 | 330 |
| C2 | 5 | 300 | 1280-2784 | 125 | 139-146 | 2686-5694 | 1343-2847 |
| C3 | 1 | 378 | 297 | 106 | 148 | 700 | 350 |
| C4 | 1 | 465 | 304 | 150 | 170 | 758 | 379 |
| C5 | 14 | 500 | 264-1947 | 130 | 177-241 | 658-4024 | 329-2012 |
| C6 | 1 | 515 | 300 | 120 | 196 | 720 | 360 |
| C7 | 1 | 529 | 300 | 120 | 202 | 720 | 360 |
| C8 | 1 | 572 | 310 | 124 | 213 | 744 | 372 |
| C9 | 1 | 602 | 288 | 128 | 236 | 704 | 352 |
| C10 | 1 | 761 | 322 | 182 | 255 | 826 | 413 |
| C11 | 1 | 909 | 304 | 150 | 332 | 758 | 379 |
| C12 | 1 | 1199 | 345 | 276 | 396 | 966 | 483 |
| C13 | 1 | 1500 | 180 | 57 | 602 | 418 | 209 |
| C14 | 1 | 1500 | 170 | 136 | 529 | 476 | 238 |

REDUCING X-MASKING EFFECT FOR LINEAR TIME COMPACTORS

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

RELATED APPLICATION

This application claims priority from U.S. Provisional Application No. 62/738,183 entitled "Reducing X-masking Effect for Finite Linear Time Compactors", which was filed on Sep. 28, 2018, and is incorporated by reference herein.

FIELD OF THE INVENTION

The present invention relates to an improved linear time compactor (LTC) that significantly reduces the X-masking effect for designs with X values (i.e., values having an unknown state), wherein the LTC supports high levels of test data compression.

BACKGROUND

A tester may provide a predetermined set of test data (test pattern) to a design under test (DUT). The test data is shifted through a plurality of shift chains of the DUT over a plurality of shift cycles. In response, the shift chains provide test response data. Rather than unloading all of the test response data from the DUT, it is common to reduce the output side test data volume by generating a compacted test response or signature. The test response data provided in response to a test pattern is viewed as a 2-dimensional bit array, where rows and columns of the array are associated, respectively, with shift cycles and scan chains of the design under test (DUT). Linear compactors compact an n-bit test response $\{0,1,X\}^n$ coming out from a DUT into a m-bit compacted test response $\{0,1,X\}^m$ such that an error in a test response bit inverts a corresponding set of compacted test response bits, where X denotes a test response bit having an unknown state and n>>m. (See, e.g., S. Mitra and K. S. Kim, "X-Compact: An Efficient Response Compaction Technique," IEEE Trans. CAD Integrated Circuits Systems, vol. 23, no. 3, pp. 421-432, March 2004.) An error in a test response bit can be masked due to either X-masking or error masking (aliasing). X-masking occurs when a test response bit has at least one X-value for each corresponding compacted test response bit. Error masking occurs when errors in multiple test response bits cancel one another in the compactor.

Linear time compactors (LTCs) are constructed based on linear codes, modular arithmetic or the Steiner system $S(2,k,m)$, such that each test response bit has a unique set of compacted test response bits or a unique erroneous signature. The 'range' of a LTC is the maximum number of compacted shift cycles that allow each test response bit to have a unique erroneous signature. A LTC is finite if its range is smaller than the length of its longest scan chain (see, e.g., J. Rajski et al., "Finite memory test response compactors for embedded test applications," in IEEE Trans. Computer Aided Design Integrated Circuits Systems, Vol. 24, No. 4, pp. 622-634, April 2005; J. Rajski, J. Tyszer, "Synthesis of X-tolerant convolutional compactors", in Proc. VLSI Test Symposium, pp. 114-119, 2005; and E. Gizdarski, "Augmented time compactor" in Proc. European Test Symposium", pp. 151-156, 2010), otherwise the LTC is infinite (see, e.g., E. Gizdarski, "Augmented time compactor" in Proc. European Test Symposium", pp. 151-156, 2010; J. Savir and W. H. McAnney, "Identification of failing tests with cycling registers," in Proc. ITC, pp. 322-328, 1988; S. Mitra, S. Lummetta and M. Mitzenmacher, "X-tolerant signature analysis", in Proc. ITC, pp. 432-441, 2004; and W. Rajski and J. Rajski, "Modular compactor of test responses," in Proc. VLSI Test Symposium, pp. 242-251, 2006). Finite LTCs typically provide streaming outputs because these LTCs compact test response bits and unload compacted test response bits. Finite LTCs are widely used for manufacturing test (where testing is performed by a tester), while infinite LTCs are typically used for in-system test (where testing is performed during functional operation through the life-time of a design).

FIG. 1 is a block diagram of a conventional streaming LTC 100 with two streaming outputs $SO_0$ and $SO_1$. Streaming LTC 100 includes a space compactor 150 and multi-input shift-registers (MISRs) 160. Space compactor 150 includes an array of exclusive OR (XOR) gates, which compacts N-bit test response data $TR_1$-$TR_N$ received from corresponding scan chains $SC_1$-$SC_N$, into 1-bit compressed test response data $CTR_1$-$CTR_{12}$, which is provided to MISRs 160. Note that in the illustrated example, l=12 (which defines the length of space compactor 150). MISRs 160 convert the compressed test response data $CTR_1$-$CTR_{12}$ into so streaming bits, wherein so is the number of streaming outputs of LTC. In the illustrated example, so=2. MISRs 160 includes XOR gates 101-110 and flip-flops 120-131, which are connected as illustrated. In general, XOR gates 101-105 and flip-flops 120-125 form a first MISR, which is a shift register that provides streaming output $SO_0$ in response to compressed test response data $CTR_1$, $CTR_2$, $CTR_5$, $CTR_6$, $CTR_9$ and $CTR_{10}$. Similarly, XOR gates 106-110 and flip-flops 126-131 form a second MISR, which is a shift register that provides streaming output $SO_1$ in response to compressed test response data $CTR_3$, $CTR_4$, $CTR_7$, $CTR_8$, $CTR_{11}$ and $CTR_{12}$.

Typically, the streaming outputs $SO_1$ and $SO_2$ provided by streaming LTC 100 are able to specify any single-bit error, double-bit error and odd multiplicity errors, and can tolerate one X-value in t-consecutive shift cycles, where t=[l/so]. In the illustrated example, t (which is the latency of streaming LTC 100) is equal to 6 cycles. The ability of streaming LTC 100 to tolerate X-values in the test response data greatly depends on the compression ratio N/l of space compactor 150 (where N and l are the number of bits in the test response data and compressed test response data, respectively).

Approaches to reduce (or completely avoid) X-masking effects have included removing X-values from the test response data before compaction (see, C. Barnhart, V. Brunkhorst, F. Distler, O. Farnsworth, B. Keller, B. Koenemann, and A. Ferko, "OPMISR: The foundation for compressed ATPG vectors," in Proc. ITC, 2001, pp. 748-757) and filtering X-values in the compacted test response data (see, M. Sharma and W. T. Cheng, "X-Filter: Filtering unknowns from compacted test responses," ITC, 2005, Paper 42.1; and N. Touba, "X-canceling MISR—An X-tolerant methodology for compacting output responses with unknowns using a MISR", in Proc. ITC, 2007).

The ability of linear space compactors to tolerate X-values has also been improved by selectively changing relations between test response bits and compressed test response bits (see, M. C. T. Chao, W. Seongmoon, S. T. Chakradhar, K-T Cheng, "Response shaper: A novel technique to enhance unknown tolerance for output response compaction" in Proc. ICCAD, 2005; O. Sinanoglu, S. Almukhaizim, "X-Align: Improving the scan cell observability of response compactors", *IEEE Tran. On VLSI Systems*, vol. 17, pp. 1392-1404, 2009; and A. Bawa and N. Touba, "Output Compaction for High X-Densities via Improved Input Rotation Compactor Design", in Proc. ITC, 2017.) The disadvantage of these methods is that they require extra control bits.

It would therefore be desirable to have improved methods and structures for reducing the X-masking effect in a linear time compactor.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

In one embodiment, a more efficient/useful electronic structure for circuit design, testing and/or manufacturing, includes a plurality of scan chains, each storing a corresponding plurality of test response bits, which are output over a corresponding plurality of shift cycles. A compactor, which may be implemented by an array of exclusive OR gates, provides compressed test response bits in response to the test response bits provided by the plurality of scan chains during each of shift cycle. The compressed test response bits include a first plurality of compressed test response bits, each generated in response to test response bits provided by a corresponding group of a first plurality of groups of the scan chains. The compressed test response bits further include a second plurality of compressed test response bits, each generated in response to test response bits provided by a corresponding group of a second plurality of groups of the scan chains. In a particular embodiment, the second plurality of groups of the scan chains are mutually exclusive. A shift-segment, including a multiple-input shift-register, receives and combines the first plurality of compressed test response bits received over a first plurality of shift cycles, thereby creating a first compacted test response vector. A hold-segment includes a plurality of single-input shift-registers, each receiving and combining a corresponding one of the second plurality of compressed test response bits received over a second plurality of shift cycles, thereby creating a second compacted test response vector. In one embodiment, the second plurality of shift cycles can be consecutive shift cycles.

In one embodiment, the multiple-input shift-register of the shift-segment includes a single feedback loop. In another embodiment, the multiple-input shift-register of the shift-segment includes multiple feedback loops.

In one embodiment, an output serializer is coupled to the shift-segment and the hold-segment, wherein the shift-segment is unloaded to the output serializer once per test pattern of the test response bits, and the hold-segment is unloaded to the output serializer multiple times per test pattern.

In another embodiment, the compressed test response bits further include a third plurality of compressed test response bits, each generated in response to test response bits provided by a corresponding group of a third plurality of groups of the scan chains. In this case, a second hold-segment, which includes a second plurality of single-input shift-registers, is added. Each of the second plurality of single-input shift-registers receives and combines a corresponding one of the third plurality of compressed test response bits received over a third plurality of shift cycles, thereby creating a third compacted test response vector.

In yet another embodiment, the compressed test response bits further include a fourth plurality of compressed test response bits, each generated in response to test response bits provided by a corresponding group of a fourth plurality of groups of the scan chains. In this case, a third hold-segment, which includes a third plurality of single-input shift-registers, is added. Each of the third plurality of single-input shift-registers receives and combines a corresponding one of the fourth plurality of compressed test response bits received over a fourth plurality of shift cycles, thereby creating a fourth compacted test response vector.

Because the first, second, third and fourth compacted test response vectors are generated in response to test response bits from different groups of the scan chains (and in some instances, from different sets of shift cycles), the X-masking effect exhibited by these compacted test response vectors is advantageously minimized.

In yet another embodiment, the compressed test response bits further include a third plurality of compressed test response bits, each generated in response to test response bits provided by a corresponding group of a third plurality of groups of the scan chains. In this embodiment, a second shift-segment includes a second multiple-input shift-register that receives and combines the third plurality of compressed test response bits received over a third plurality of shift cycles, thereby creating a third compacted test response vector.

In another embodiment, a more efficient/useful electronic structure for circuit design, testing and/or manufacturing, includes a plurality of scan chains, each storing a corresponding plurality of test response bits, which are output over a corresponding plurality of shift cycles. A compactor provides a plurality of compressed test response bits in response to the plurality of test response bits provided during each of the shift cycles, wherein each of the compressed test response bits is generated in response to test response bits provided by a mutually exclusive group of the scan chains. A dual-segment register includes: (1) a first circular multiple-input shift-register that receives and combines a first subset of the plurality of compressed test response bits received over a first plurality of shift cycles, and (2) a second circular multiple-input shift-register that receives and combines a second subset of the plurality of compressed test response bits received over the first plurality of shift cycles, wherein the first and second subsets are mutually exclusive. In one embodiment, the dual-segment register further includes: (3) a third circular multiple-input shift-register that receives and combines a third subset of the plurality of compressed test response bits received over the first plurality of shift cycles, wherein the first, second and third subsets are mutually exclusive.

In another embodiment, a method includes: (1) providing a plurality of test response bits from a corresponding plurality of scan chains over a plurality of shift cycles; (2) providing compressed test response bits in response to the plurality of test response bits provided by the plurality of scan chains during each of the shift cycles, wherein the compressed test response bits include a first plurality of compressed test response bits, each generated in response to test response bits provided by a corresponding group of a first plurality of groups of the scan chains, and wherein the compressed test response bits further include a second plurality of compressed test response bits, each generated in response to test response bits provided by a corresponding group of a second plurality of groups of the scan chains; (3) receiving and combining the first plurality of compressed test response bits in a multiple-input shift-register over a first plurality of shift cycles, thereby creating a first compacted test response vector; and (4) separately receiving and combining each of the second plurality of compressed test response bits in a corresponding single-input shift-register over a second plurality of shift cycles, thereby creating a second compacted test response vector.

In one embodiment, the second plurality of groups of the scan chains are mutually exclusive. In another embodiment, the second plurality of shift cycles are consecutive shift cycles.

In one embodiment, the first and second compacted test response vectors are serialized and provided to an external tester. In another embodiment, the first compacted test response vector is provided as an output once per test pattern of the test response bits, and the second compacted test response vector is provided as an output multiple times per test pattern of the test response bits.

In another embodiment, the compressed test response bits further include a third plurality of compressed test response bits, each generated in response to test response bits provided by a corresponding group of a third plurality of groups of the scan chains. In this case, the method further includes separately receiving and combining each of the third plurality of compressed test response bits in a corresponding single-input shift-register over a third plurality of shift cycles, thereby creating a third compacted test response vector.

In yet another embodiment, the compressed test response bits further include a fourth plurality of compressed test response bits, each generated in response to test response bits provided by a corresponding group of a fourth plurality of groups of the scan chains. In this case, the method further includes separately receiving and combining each of the fourth plurality of compressed test response bits in a corresponding single-input shift-register over a fourth plurality of shift cycles, thereby creating a fourth compacted test response vector.

In yet another embodiment, the compressed test response bits further include a third plurality of compressed test response bits, each generated in response to test response bits provided by a corresponding group of a third plurality of groups of the scan chains. In this case, the method further includes receiving and combining the third plurality of compressed test response bits in a second multiple-input shift-register over a third plurality of shift cycles, thereby creating a third compacted test response vector.

The present invention will be more fully understood in view of the following description and drawings.

IN THE DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 9 is a table that specifies fourteen configurations C1-C14, including thirty-one DFTMAX Ultra benchmark designs used for validation of the embodiments described herein.

Figure 1:
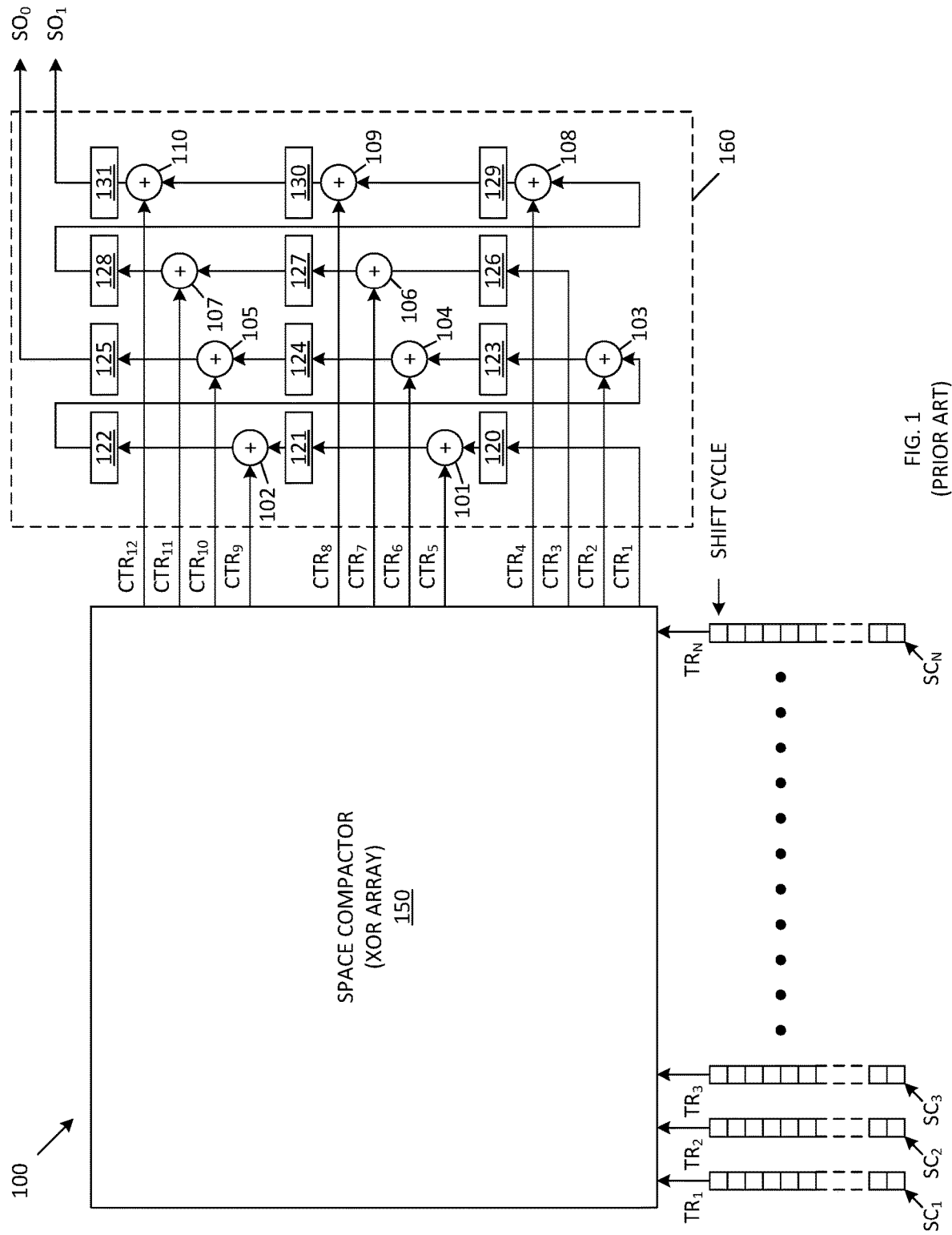
FIG. 1 is a block diagram of a conventional streaming linear time compactor (LTC).

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Test data compression techniques exploit the fact that detection of a fault requires specific values and observation of a few scan cells per test pattern. However, the presence of X-values in a test response reduces observability in compression mode. Aggressive design-style and practices, and sophisticated fault models often result in the creation of X-values because the value captured in a scan cell cannot be predicted by a zero-delay simulation used by an automatic test pattern generation (ATPG) tool. Some X-values are known at design stage while other X-values appear because of timing, operating parameters or manufacturing defects. An efficient architecture for test data compression must support high compression ratios when the number of X-values in a test response varies in a wide range. A higher compression ratio magnifies the X-masking effect because it increases the number of X-values per compacted test response bit (referred hereafter as the X-density). In addition, a test architecture must support efficient diagnosis and debugging.

Figure 2:
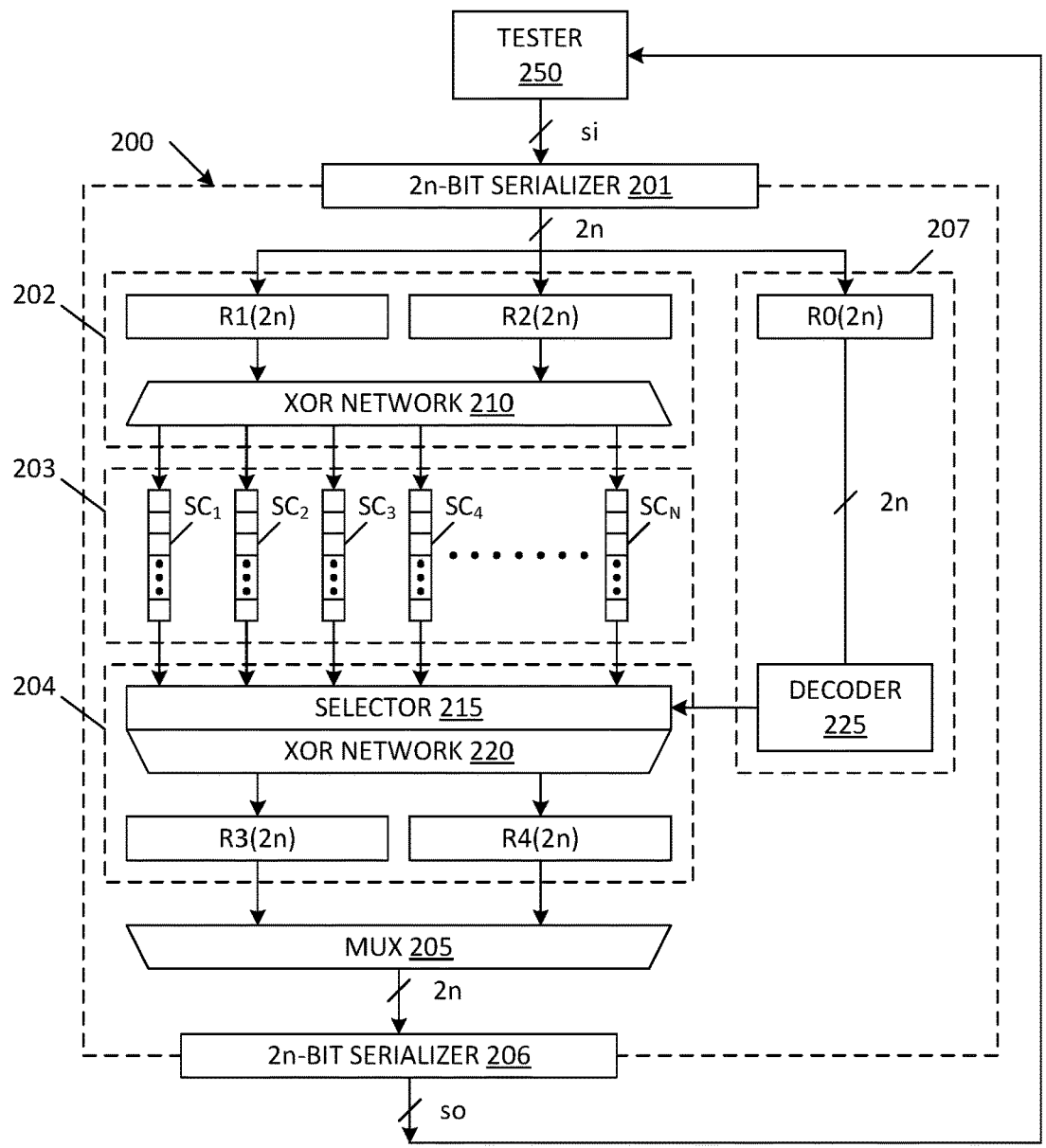
FIG. 2 is a diagram of an augmented test architecture (ATA) in accordance with one embodiment of the present invention.

FIG. 2 is a block diagram of an augmented test architecture (ATA) 200 in accordance with one embodiment of the present invention. ATA 200 includes 2n-bit input serializer 201, augmented decompressor 202, scan chain structure 203, augmented X-tolerant linear time compactor (AXC) 204, multiplexer 205, 2n-bit output serializer 206 and multi-mode selector 207. Augmented decompressor 202 includes 2n-bit registers R1 and R2 and XOR network 210. Multi-mode selector 207 includes 2n-bit register R0 and decoder 225. Scan chain structure 203 includes a plurality of scan chains $SC_1$-$SC_N$, which receive input test data from XOR network 210. Augmented X-tolerant linear time compactor 204 includes selector circuit 215, XOR network (compactor) 220 and 2n-bit registers R3 and R4.

ATA 200 includes an efficient mechanism for routing input test data received from a tester 250, and an efficient mechanism for routing output test data to tester 250. More specifically, ATA 200 includes a 2n-bit input serializer 201 that receives si-bit streaming input test data from tester 250 and converts this into 2n-bit input test data, and a 2n-bit output serializer 206 that converts 2n-bit output test data into so-bit streaming output test data, which is sent back to tester 250.

The input test data includes static and dynamic seeds, which are provided to registers R1 and R2, respectively, in augmented decompressor 202 (see, e.g., E. Gizdarski, "Two-step dynamic encoding for linear decompressors," Proc. Asian Test Symposium, pp. 330-335, 2014; and E. Gizdarski, P. Wohl, J. Waicukauski, "A new paradigm for synthesis of linear decompressors," Design Automation Conference, Article 39, 2017, which are hereby incorporated by reference). The static and dynamic seeds are provided to XOR network 210, and in response, XOR network 210 provides input test data to scan chains $SC_1$-$SC_N$. This input test data is shifted through the scan chains $SC_1$-$SC_N$ (over a plurality of shift cycles) and is provided to selector 215 as test response data.

The input test data also includes control seeds, which are provided to register R0 in multimode selector 207 using mutually orthogonal partitions (see, e.g., E. Gizdarski, "Constructing augmented multimode compactors", in Proc. VLSI Test Symposium, pp. 29-34, 2008, which is hereby incorporated by reference). The control seeds stored in register R0 are provided to decoder 225, which controls the manner in which the selector circuit 215 routes the test response data through selector circuit 215 to XOR network 220.

XOR network 220 provides compressed test response data to registers R3 and R4, which store and further process the received compressed test response data over a plurality of cycles, thereby generating 2n-bit static and dynamic signatures, each including two n-bit compacted test response vectors (i.e., each compacted test response vector includes n compacted test response bits). Note that the static and dynamic signatures are partial, and they include a subset of 2n compacted test response bits of a test pattern. Registers R3 and R4 provide the generated static and dynamic signatures to multiplexer 205, which selectively routes these signatures to 2n-bit output serializer 206. 2n-bit output serializer 206 serializes the received signatures and routes the results to tester 250 on so serial channels.

Figure 3:
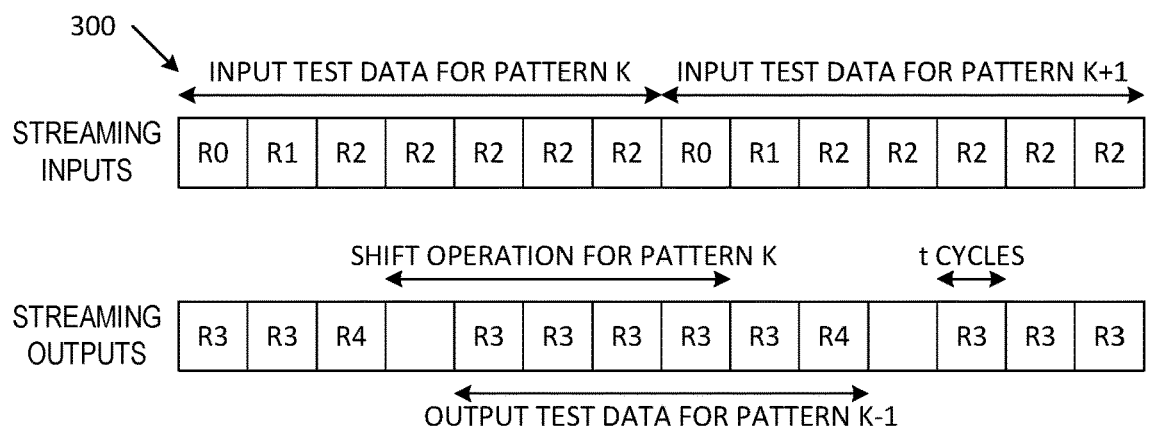
FIG. 3 is a timing diagram that illustrates the exchange of test data between the ATA of FIG. 2 and a tester.

FIG. 3 is timing diagram 300 that shows test data exchange between ATA 200 and tester 250 when si=so. For each test pattern, a control seed is loaded in register R0, a static seed is loaded in register R1 (before starting shift operations), and then dynamic seeds are loaded in register R2 per t shift cycles, where t=2n/si and t≤n. Note that t defines the 'scope' of the dynamic seeds. Similarly, dynamic signatures (a subset of compacted test response bits) are unloaded from register R3 per t shift cycles where t=2n/so and t≤n. Note that t defines the 'scope' of the dynamic signatures. A static signature (a subset of compacted test response bits) is unloaded from register R4 at the end of each test pattern. In examples described below in connection with FIGS. 4A-4C, n=3, si=so=2 and t=3. Note that a shift operation loads the test stimulus for the current test pattern and unloads the test response of the previous test pattern. Also note that the output test data includes one empty slot per test pattern because the input test data includes a 2n-bit control seed (which does not produce corresponding output test data). The bandwidth of tester 250 is optimized (i.e., no empty slots exist in the output test data) when si=2so.

Desirable properties of augmented X-tolerant compactor (AXC) 204, which are described in more detail below, include: 1) each scan cell (i.e., each entry of the scan chains $SC_1$-$SC_N$ and a corresponding shift cycle) has a unique erroneous signature; 2) scan chains $SC_1$-$SC_N$ are divided into groups (by the compacted test response bits in registers R3 and R4) such that X-masking between defined groups of scan chains is impossible; 3) shift cycles are divided into groups (by the compacted test response bits in registers R3 and R4) such that X-masking between defined groups of shift cycles is impossible; 4) scan cells of each scan chain are divided into groups (by compacted test response bits in registers R3 and R4) such that scan cells in n-consecutive positions belong to different groups (where n is the maximum scope of the dynamic signatures); and 5) each scan cell can be directly unloaded at a streaming output (using a selector such that at most so scan chains are selected for observation wherein so is the number of streaming outputs). Note that properties 2 and 3 are distinctive features of AXC 204 in accordance with various embodiments.

Specific examples of AXC 204 will now be described. The first example provided below (FIGS. 4A-4C), describes a finite AXC that includes four n-bit segments $S_0$, $S_1$, $S_2$ and $S_3$ such that the compacted test response vectors stored by segments $S_0$ and $S_1$ are unloaded per test pattern and the compacted test response vectors stored by segments $S_2$ and $S_3$ are dynamically unloaded per t shift cycles where t=n/so (so is the number of streaming outputs).

Figure 4A:
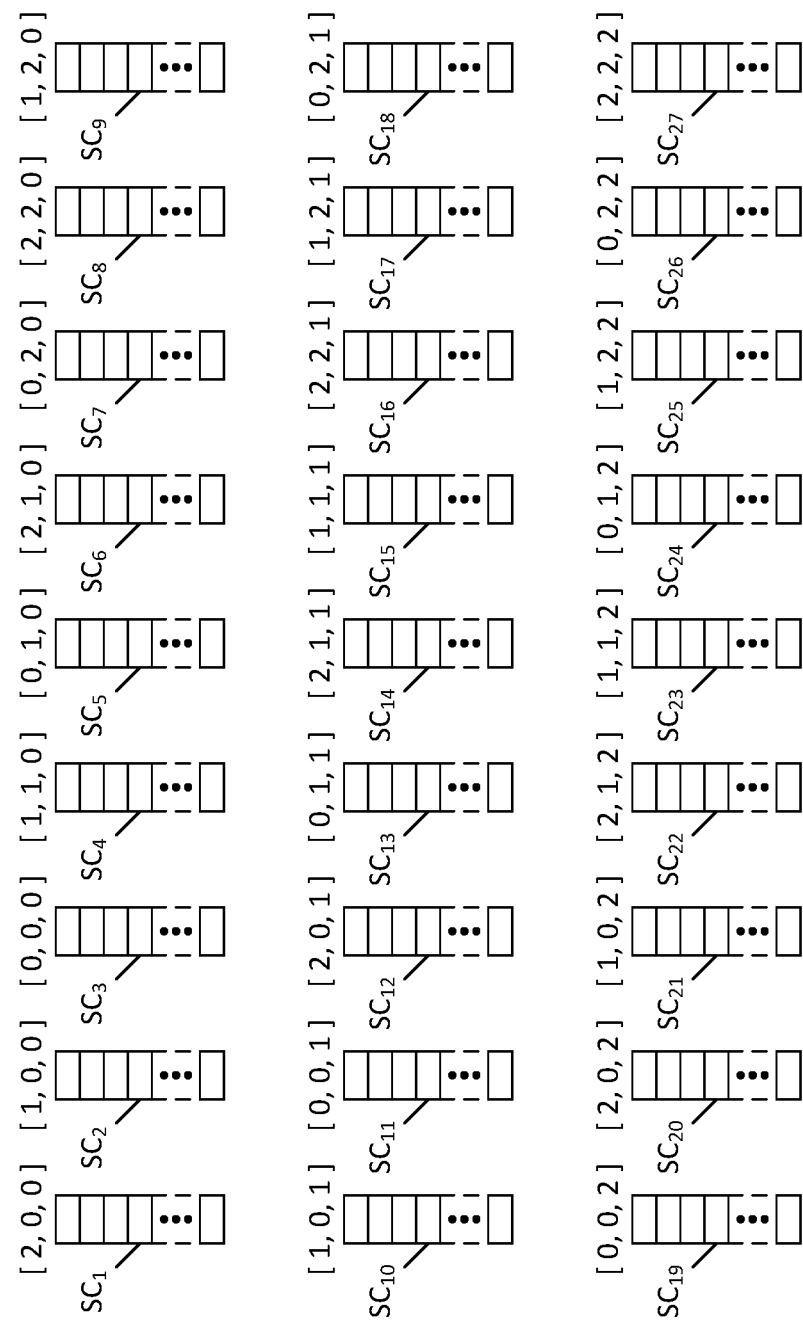
FIG. 4A is a block diagram illustrating the coding of 27 shift chains in accordance with one embodiment of the present invention.

FIG. 4A is a block diagram illustrating the coding of 27 shift chains $SC_1$-$SC_{27}$ (N=27) in accordance with one embodiment of the present invention. Each of the shift chains $SC_1$-$SC_{27}$ is coded using an [x, y, z] format, wherein x, y and z include values from the set: 0, 1 and 2. As illustrated, shift chains $SC_1$-$SC_{27}$ have corresponding coding values of [2,0,0], [1,0,0], [0,0,0], [1,1,0], [0,1,0], [2,1,0], [0,2,0], [2,2,0], [1,2,0], [1,0,1], [0,0,1], [2,0,1], [0,1,1], [2,1,1], [1,1,1], [2,2,1], [1,2,1], [0,2,1], [0,0,2], [2,0,2], [1,0,2], [2,1,2], [1,1,2], [0,1,2], [1,2,2], [0,2,2] and [2,2,2], respectively. It is understood that other coding values can be used in other embodiments.

Figure 4B:
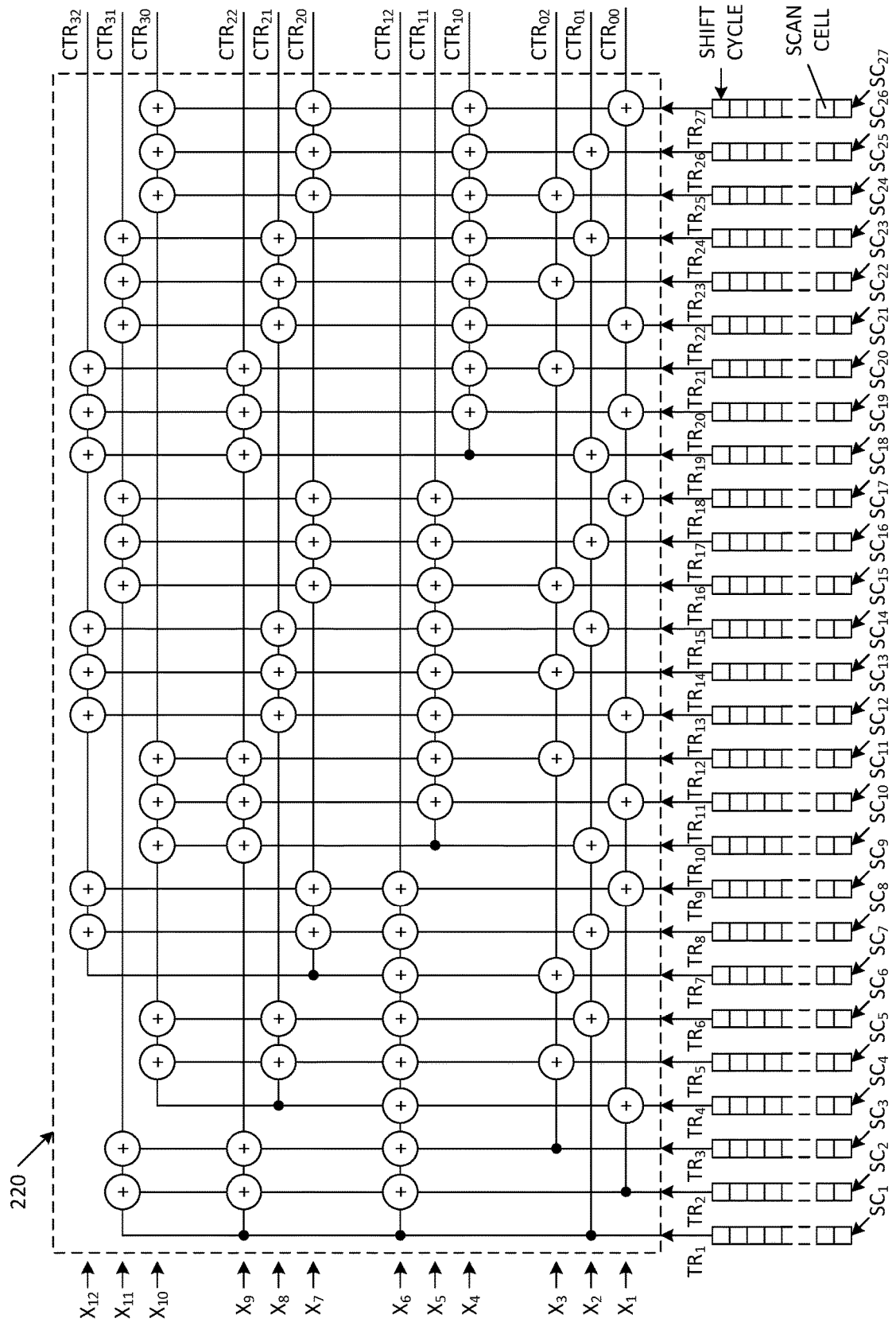
FIG. 4B is a block diagram illustrating details of an XOR network of the ATA of FIG. 2, including the manner in which XOR network receives test response data from the shift chains of FIG. 4A.

FIG. 4B is a block diagram illustrating details of XOR network 220, as well as the manner in which the test response data $TR_1$-$TR_{27}$ from shift chains $SC_1$-$SC_{27}$ is provided to XOR network 220. The selector circuit 215, which routes the test response data $TR_1$-$TR_{27}$ from shift chains $SC_1$-$SC_{27}$ to XOR network 220, is not shown in FIG. 4B for clarity. XOR network 220, which is configured as a space compactor, includes l sets $X_1$-$X_{12}$ of exclusive OR gates, wherein l is the length of the compactor, and wherein each exclusive OR gate is illustrated as a circle containing a '+' symbol in FIG. 4B.

XOR network 220 is configured to output three compressed test response bits $CTR_{00}$, $CTR_{01}$ and $CTR_{02}$ by performing exclusive OR operations on test response data received from three mutually exclusive groups $G_1$, $G_2$ and $G_3$ of shift chains $SC_1$-$SC_{27}$. These three groups $G_1$-$G_3$ of shift chains $SC_1$-$SC_{27}$ are defined by the applying the function (x+z)mod 3 to the coding values of the shift chains $SC_1$-$SC_{27}$.

Thus, shift chains having coding values with (x+z)mod 3=1 (i.e., shift chains $SC_2$, $SC_4$, $SC_9$, $SC_{11}$, $SC_{13}$, $SC_{18}$, $SC_{20}$, $SC_{22}$ and $SC_{27}$) form group $G_1$, and are coupled to exclusive OR gate set $X_1$, which provides the compressed test response bit $CTR_{00}$.

Shift chains having coding values with (x+z)mod 3=2 (i.e., shift chains $SC_1$, $SC_6$, $SC_8$, $SC_{10}$, $SC_{15}$, $SC_{17}$, $SC_{19}$, $SC_{24}$ and $SC_{26}$) form group $G_2$, and are coupled to exclusive OR gate set $X_2$, which provides the compressed test response bit $CTR_{01}$.

Shift chains having coding values with (x+z)mod 3=0 (i.e., shift chains $SC_3$, $SC_5$, $SC_7$, $SC_{12}$, $SC_{14}$, $SC_{16}$, $SC_{21}$, $SC_{23}$ and $SC_{25}$) form group $G_3$, and are coupled to exclusive OR gate set $X_3$, which provides the compressed test response bit $CTR_{02}$.

XOR network 220 is further configured to output three compressed test response bits $CTR_{10}$, $CTR_{11}$ and $CTR_{12}$ by performing exclusive OR operations on test response data received from three mutually exclusive groups $G_4$, $G_5$ and $G_6$ of shift chains $SC_1$-$SC_{27}$. These three groups $G_4$-$G_6$ of shift chains $SC_1$-$SC_{27}$ are defined by the applying the function (x) to the coding values of the shift chains $SC_1$-$SC_{27}$.

Thus, shift chains having coding values with (x)=0 (i.e., shift chains $SC_1$-$SC_9$) form group $G_6$, and are coupled to exclusive OR gate set $X_6$, which provides the compressed test response bit $CTR_{12}$.

Shift chains having coding values with (x)=1 (i.e., shift chains $SC_{10}$-$SC_{18}$) form group $G_5$, and are coupled to exclusive OR gate set $X_5$, which provides the compressed test response bit $CTR_{11}$.

Shift chains having coding values with (x)=2 (i.e., shift chains $SC_{19}$-$SC_{27}$) form group $G_4$, and are coupled to exclusive OR gate set $X_4$, which provides the compressed test response bit $CTR_{10}$.

XOR network 220 is further configured to output three compressed test response bits $CTR_{20}$, $CTR_{21}$ and $CTR_{22}$ by performing exclusive OR operations on test response data received from three mutually exclusive groups $G_7$, $G_8$ and $G_9$ of shift chains $SC_1$-$SC_{27}$. These three groups $G_7$-$G_9$ of shift chains $SC_1$-$SC_{27}$ are defined by the applying the function (y) to the coding values of the shift chains $SC_1$-$SC_{27}$.

Thus, shift chains having coding values with (y)=0 (i.e., shift chains $SC_1$-$SC_3$, $SC_{10}$-$SC_{12}$ and $SC_{19}$-$SC_{21}$) form group $G_9$, and are coupled to exclusive OR gate set $X_9$, which provides the compressed test response bit $CTR_{22}$.

Shift chains having coding values with (y)=1 (i.e., shift chains $SC_4$-$SC_6$, $SC_{13}$-$SC_{15}$ and $SC_{22}$-$SC_{24}$) form group $G_8$, and are coupled to exclusive OR gate set $X_8$, which provides the compressed test response bit $CTR_{21}$.

Shift chains having coding values with (y)=2 (i.e., shift chains $SC_7$-$SC_9$, $SC_{16}$-$SC_{18}$ and $SC_{25}$-$SC_{27}$) form group $G_7$, and are coupled to exclusive OR gate set $X_7$, which provides the compressed test response bit $CTR_{20}$.

XOR network 220 is further configured to output three compressed test response bits $CTR_{30}$, $CTR_{31}$ and $CTR_{32}$ by performing exclusive OR operations on test response data received from three mutually exclusive groups $G_{10}$, $G_{11}$ and $G_{12}$ of shift chains $SC_1$-$SC_{27}$. These three groups $G_{10}$-$G_{12}$ of shift chains $SC_1$-$SC_{27}$ are defined by the applying the function (x+y)mod 3 to the coding values of the shift chains $SC_1$-$SC_{27}$.

Thus, shift chains having coding values with (x+y)mod 3=1 (i.e., shift chains $SC_4$-$SC_6$, $SC_{10}$-$SC_{12}$ and $SC_{25}$-$SC_{27}$) form group $G_{10}$, and are coupled to exclusive OR gate set $X_{10}$, which provides the compressed test response bit $CTR_{30}$.

Shift chains having coding values with (x+y)mod 3=2 (i.e., shift chains $SC_7$-$SC_9$, $SC_{13}$-$SC_{15}$ and $SC_{19}$-$SC_{21}$) form group $G_{12}$, and are coupled to exclusive OR gate set $X_{12}$, which provides the compressed test response bit $CTR_{32}$.

Shift chains having coding values with (x+y)mod 3=0 (i.e., shift chains $SC_1$-$SC_3$, $SC_{16}$-$SC_{18}$ and $SC_{22}$-$SC_{24}$) form group $G_{11}$, and are coupled to exclusive OR gate set $X_{11}$, which provides the compressed test response bit $CTR_{31}$.

As described in more detail below, the coding implemented by XOR network 220 advantageously reduces X-masking, reduces the number of tester cycles per test pattern and improves the efficiency of related processes.

Figure 4C:
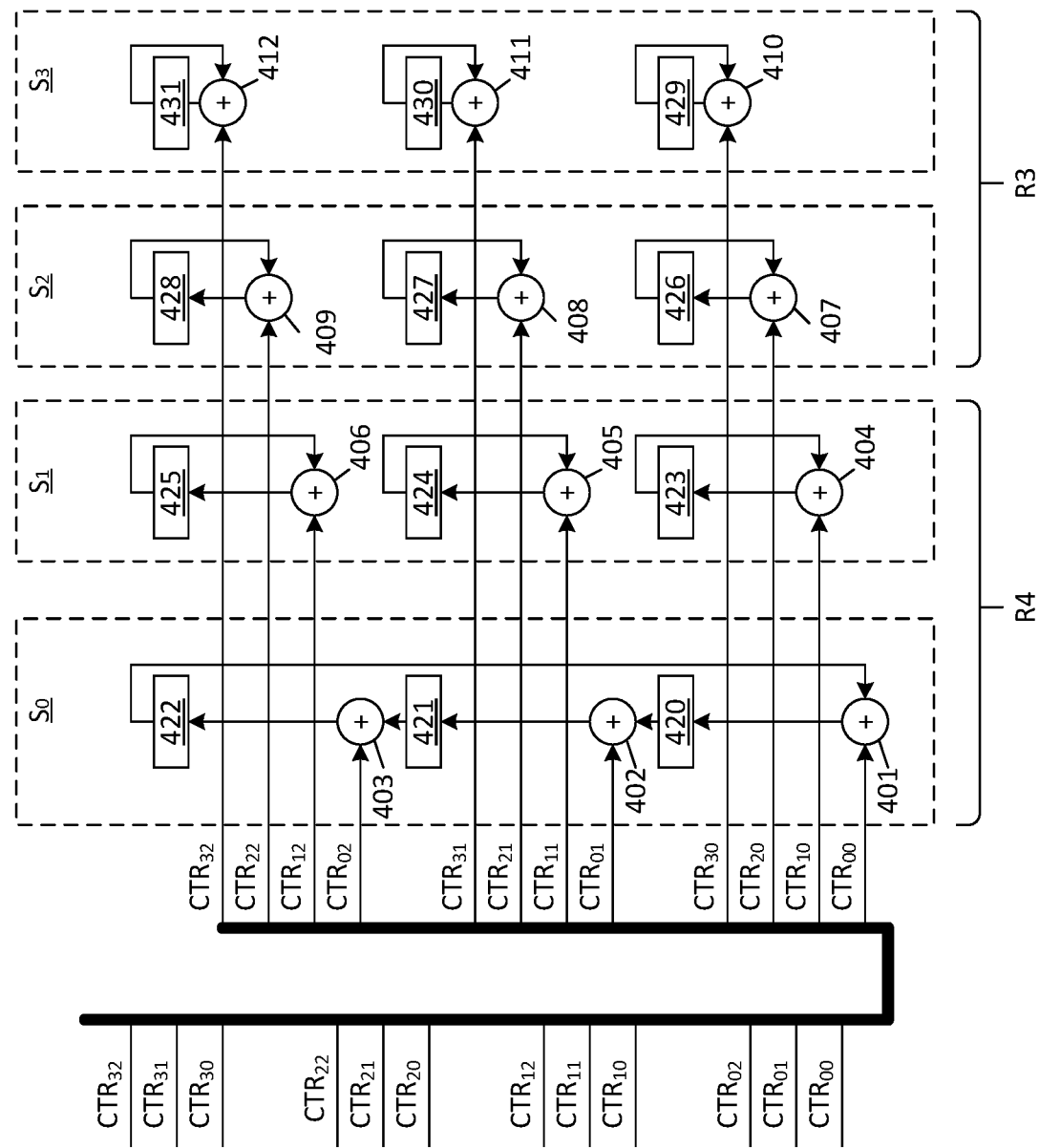
FIG. 4C is a block diagram illustrating details of registers R3 and R4 that receive compressed test response bits from the XOR network of FIG. 4B in accordance with one embodiment of the present invention.

FIG. 4C is a block diagram illustrating details of registers R3 and R4 of AXC 204 in accordance with one embodiment, as well as the manner in which the compressed test response bits $CTR_{00}$, $CTR_{01}$, $CTR_{02}$, $CTR_{10}$, $CTR_{11}$, $CTR_{12}$, $CTR_{20}$, $CTR_{21}$, $CTR_{22}$, $CTR_{30}$, $CTR_{31}$ and $CTR_{32}$ are provided to registers R3 and R4. Register R4 includes segments $S_0$ and $S_1$, and register R3 includes segments $S_2$ and $S_3$.

Segment $S_0$ of register R4 includes XOR gates 401, 402 and 403, which are coupled to receive compressed test response bits $CTR_{00}$, $CTR_{01}$ and $CTR_{02}$, respectively. XOR gates 401, 402 and 403 are also coupled to outputs of flip-flops 422, 420 and 421, respectively. The outputs of XOR gates 401, 402 and 403 are coupled to inputs of flip-flops 420, 421 and 422, respectively. Thus, segment $S_0$ is an n-bit circular shift register (wherein n=3). Note that segment $S_0$ is also considered a multiple-input shift-register. Flip-flops 420-422 of segment $S_0$ store an n-bit intermediate and final compacted test response vector. Hereafter, segment $S_0$ may be referred to as a shift-segment (because data is shifted between flip-flops 420-422). As described above, the compressed test response bits $CTR_{00}$, $CTR_{01}$ and $CTR_{02}$ are provided by mutually exclusive groups $G_1$, $G_2$ and $G_3$, respectively, of scan chains $SC_1$-$SC_{27}$. The n-bit circular register of segment $S_0$ effectively divides the scan cells in scan chains $SC_1$-$SC_{27}$ into n (3) sets, such that scan cells in n consecutive shift cycles belong to n different sets (partition 1). For example, after 3 consecutive shift cycles, the following conditions may exist within segment $S_0$.

Flip-flop 422 will store a value that is the exclusive OR of: (1) a compressed test response bit $CTR_{00}$ provided in response to the contents of scan cells of group $G_1$ during a first shift cycle (k); (2) a compressed test response bit $CTR_{01}$ provided in response to the contents of scan cells of group $G_2$ during a second consecutive shift cycle (k+1); and (3) a compressed test response bit $CTR_{02}$ provided in response to the contents of scan cells of group $G_3$ during a third consecutive shift cycle (k+2). These scan cells of groups $G_1$, $G_2$ and $G_3$ belong to a first set of scan cells within scan chains $SC_1$-$SC_{27}$.

Similarly, flip-flop 421 will store a value that is the exclusive OR of: (1) a compressed test response bit $CTR_{02}$ provided in response to the contents of scan cells of group $G_3$ during the first shift cycle (k); (2) a compressed test response bit $CTR_{00}$ provided in response to the contents of scan cells of group $G_1$ during the second consecutive shift cycle (k+1); and (3) a compressed test response bit $CTR_{01}$ provided in response to the contents of scan cells of group $G_2$ during the third consecutive shift cycle (k+2). These scan cells of groups $G_1$, $G_2$ and $G_3$ belong to a second set of scan cells within scan chains $SC_1$-$SC_{27}$.

In addition, flip-flop 420 will store a value that is the exclusive OR of: (1) a compressed test response bit $CTR_{01}$ provided in response to the contents of scan cells of group $G_2$ during the first shift cycle (k); (2) a compressed test response bit $CTR_{02}$ provided in response to the contents of scan cells of group $G_3$ during the second consecutive shift cycle (k+1); and (3) a compressed test response bit $CTR_{00}$ provided in response to the contents of scan cells of group $G_1$ during the third consecutive shift cycle (k+2). These scan cells of groups $G_1$, $G_2$ and $G_3$ belong to a third set of scan cells within scan chains $SC_1$-$SC_{27}$.

The above-described first, second and third sets of scan cells within scan chains $SC_1$-$SC_{27}$ define a first partition (partition 1) of AXC 204, wherein X-masking between these three separate sets of scan cells within segment $S_0$ is impossible.

Turning now to segment $S_1$ of register R4, this segment $S_1$ includes XOR gates 404, 405 and 406, which are coupled to receive compressed test response bits $CTR_{10}$, $CTR_{11}$ and $CTR_{12}$, respectively. The outputs of XOR gates 404, 405 and 406 are coupled to inputs of flip-flops 423, 424 and 425, respectively. XOR gates 404, 405 and 406 also have inputs coupled to the outputs of flip-flops 423, 424 and 425, respectively. Flip-flops 423-425 of segment $S_1$ store an n-bit intermediate and final compacted test response vector. Segment $S_1$ is referred to herein as a hold-segment, because the flip-flops 423, 424 and 425 effectively 'hold' the outputs of XOR gates 404, 405 and 406, respectively. (As described in more detail below, segments $S_2$ and $S_3$ are also hold-segments.) Hold-segment $S_1$ includes n separate single-input shift-registers of length 1 (wherein XOR gate 404 and flip-flop 423 form a first single-input shift-register, XOR gate 405 and flip-flop 424 form a second single-input shift-register, and XOR gate 406 and flip-flop 425 form a third single-input shift-register). As described above, the compressed test response bits $CTR_{10}$, $CTR_{11}$ and $CTR_{12}$ are provided by mutually exclusive groups $G_4$, $G_5$ and $G_6$, respectively, of scan chains $SC_1$-$SC_{27}$. Thus, segment $S_1$ divides the scan chains $SC_1$-$SC_{27}$ into n (3) groups $G_4$, $G_5$ and $G_6$ such that all scan chains in each group are coupled to the same flip-flop within segment $S_1$ (i.e., the scan chains of group $G_4$ are coupled to flip-flop 423, the scan chains of group $G_5$ are coupled to flip-flop 424, and the scan chains of group $G_6$ are coupled to flip-flop 425). The groups $G_4$, $G_5$ and $G_6$ of segment $S_1$ define a second partition (partition 2) of AXC 204, wherein X-masking between these three mutually exclusive groups of scan chains within segment $S_1$ is impossible.

In the manner described above, segment $S_1$ forms an n (3) bit register, such that segments $S_0$ and $S_1$ combine to form the 2n (6) bit register R4. As described above in connection with FIG. 3, the contents of segments $S_0$ and $S_1$ (i.e., the static signature of register R4) are unloaded once per test pattern. Note that a test pattern is defined as test stimulus which are loaded into the scan chains and test response unloaded from the scan chains. A test pattern includes compressed test stimulus and compacted test response.

Segment $S_2$ of register R3 includes XOR gates 407, 408 and 409, which are coupled to receive compressed test response bits $CTR_{20}$, $CTR_{21}$ and $CTR_{22}$, respectively. The outputs of XOR gates 407, 408 and 409 are coupled to inputs of flip-flops 426, 427 and 428, respectively. XOR gates 407, 408 and 409 also have inputs coupled to the outputs of flip-flops 426, 427 and 428, respectively. Segment $S_2$ is therefore a hold-segment that includes an n (3) bit register. Stated another way, hold-segment $S_2$ includes n separate single-input shift-registers of length 1 (wherein XOR gate 407 and flip-flop 426 form a first single-input shift-register, XOR gate 408 and flip-flop 427 form a second single-input shift-register, and XOR gate 409 and flip-flop 428 form a third single-input shift-register). Flip-flops 426-428 of segment $S_2$ store an n-bit intermediate and final compacted test response vector. As described above, the compressed test response bits $CTR_{20}$, $CTR_{21}$ and $CTR_{22}$ are provided by mutually exclusive groups $G_7$, $G_8$ and $G_9$, respectively, of scan chains $SC_1$-$SC_{27}$. Thus, segment $S_2$ divides the scan chains $SC_1$-$SC_{27}$ into n (3) groups $G_7$, $G_8$ and $G_9$ such that all scan chains in each group are coupled to the same flip-flop within segment $S_2$ (i.e., the scan chains of group $G_7$ are coupled to flip-flop 426, the scan chains of group $G_8$ are coupled to flip-flop 427, and the scan chains of group $G_9$ are coupled to flip-flop 428). The groups $G_7$, $G_8$ and $G_9$ of segment $S_2$ define a third partition (partition 3) of AXC 204, wherein X-masking between these three mutually exclusive groups of scan chains within segment $S_2$ is impossible.

Segment $S_3$ of register R3 includes XOR gates 410, 411 and 412, which are coupled to receive compressed test response bits $CTR_{30}$, $CTR_{31}$ and $CTR_{32}$, respectively. The outputs of XOR gates 410, 411 and 412 are coupled to inputs of flip-flops 429, 430 and 431, respectively. XOR gates 410, 411 and 412 also have inputs coupled to the outputs of flip-flops 429, 430 and 431, respectively. Segment $S_3$ is therefore a hold-segment that includes an n (3) bit register. Stated another way, hold-segment $S_3$ includes n separate single-input shift-registers of length 1 (wherein XOR gate 410 and flip-flop 429 form a first single-input shift-register, XOR gate 411 and flip-flop 430 form a second single-input shift-register, and XOR gate 412 and flip-flop 431 form a third single-input shift-register). Flip-flops 429-431 of segment $S_3$ store an n-bit intermediate and final compacted test response vector. As described above, the compressed test response bits $CTR_{30}$, $CTR_{31}$ and $CTR_{32}$ are provided by mutually exclusive groups $G_{10}$, $G_{11}$ and $G_{12}$, respectively, of scan chains $SC_1$-$SC_{27}$. Thus, segment $S_3$ divides the scan chains $SC_1$-$SC_{27}$ into n (3) groups $G_{10}$, $G_{11}$ and $G_{12}$ such that all scan chains in each group are coupled to the same flip-flop within segment $S_3$ (i.e., the scan chains of group $G_{10}$ are coupled to flip-flop 429, the scan chains of group $G_{11}$ are coupled to flip-flop 430, and the scan chains of group $G_{12}$ are coupled to flip-flop 431). The groups $G_{10}$, $G_{11}$ and $G_{11}$ of segment $S_3$ define a fourth partition (partition 4) of AXC 204, wherein X-masking between these three mutually exclusive groups of scan chains within segment $S_3$ is impossible.

In the manner described above, segment $S_3$ forms an n (3) bit register, such that segments $S_2$ and $S_3$ combine to form the 2n (6) bit register R3. As described above in connection with FIG. 3, the contents of segments $S_2$ and $S_3$ (i.e., the dynamic signature of register R3) are unloaded once per t shift cycles, where t=2n/so (so is the number of streaming outputs). In the illustrated example, n=3 and so=2, such that t=3 cycles.

Unloading segments $S_2$ and $S_3$ once per t shift cycles effectively divides the shift cycles into l/t groups (wherein l is the number of scan cells per scan chain, i.e., the length of the scan chain) such that shift cycles having same quotient by modulo t belong to the same group (i.e., shift cycles 0, 1, and 2 of scan chains $SC_1$-$SC_{27}$ belong to a first group of shift cycles, shift cycles 3, 4 and 5 of scan chains $SC_1$-$SC_{27}$ belong to a second group of shift cycles, etc.) These groups of shift cycles define a fifth partition (partition 5) of AXC 204, wherein X-masking between these separate groups of shift cycles within register R3 is impossible.

As described in more detail below, preventing X-masking within partitions 1-5 in the manner described above advantageously provides for improved visibility of X-values within ATA 200.

As described above, segment $S_0$ is a shift-segment (which includes a circular multiple-input shift register arranged in a single loop), and each of segments $S_1$, $S_2$ and $S_3$ is a hold-segment (which includes a plurality of separate loops). In accordance with one variation, a segment has a dual-segment configuration, which is a combination of a shift-segment and a hold-segment.

Figure 5:
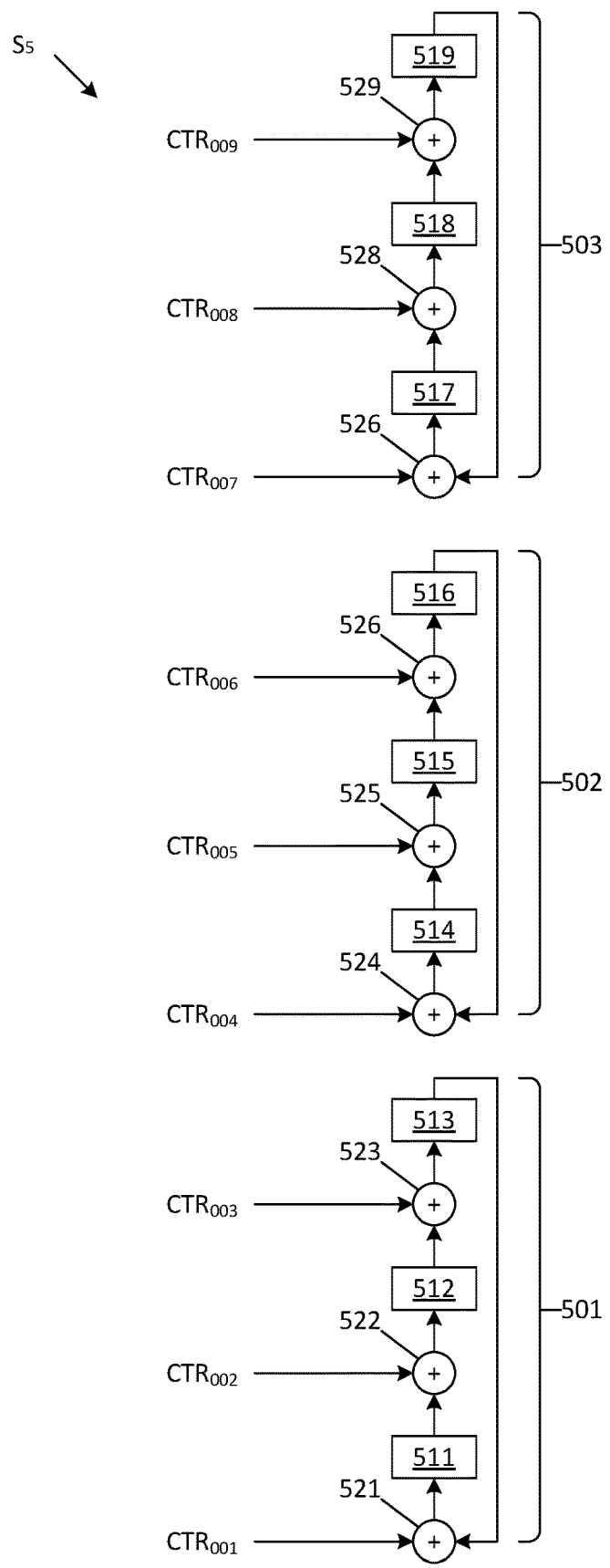
FIG. 5 is a block diagram of a dual-segment including three shift-subsegments in accordance with one embodiment of the present invention.

FIG. 5 is a block diagram of a dual-segment $S_5$ that includes g shift-subsegments 501-503 of size k, where g=3 and k=3. Shift-subsegment 501 includes flip-flops 511-513 and XOR gates 521-523, shift-subsegment 502 includes flip-flops 514-516 and XOR gates 524-526, and shift-subsegment 503 includes flip-flops 517-519 and XOR gates 526-529. Each of the shift-subsegments 501-503 has the same general configuration as shift-segment $S_0$ (FIG. 4C). That is, each of the shift-subsegments 501-503 is a circular multiple-input shift-register arranged in a single loop. In addition, each of the shift-subsegments 501-503 forms a separate loop, similar to the hold-segments $S_1$, $S_2$ and $S_3$ (FIG. 4C). Flip-flops 511-519 of dual-segment $S_5$ store a k*g-bit intermediate and final compacted test response vector.

The XOR gates 521-529 of dual-segment $S_5$ are coupled to receive compressed test response bits $CTR_{001}$-$CTR_{009}$, respectively, from XOR network 220. In this embodiment, XOR network 220 is configured such that the scan chains $SC_1$-$SC_{27}$ are divided into k*g (e.g., 9) mutually exclusive groups. Because there are 27 scan chains $SC_1$-$SC_{27}$ in the described examples, each of these 9 mutually exclusive groups includes three of the scan chains $SC_1$-$SC_{27}$. Test response values from each group of three scan chains are provided to corresponding exclusive OR circuits (in the manner described above in FIG. 4B), thereby generating the nine compressed test response bits $CTR_{001}$-$CTR_{009}$.

In this manner, each of the compressed test response bits $CTR_{001}$-$CTR_{009}$ is generated by a unique group of 3 of the scan chains $SC_1$-$SC_{27}$. As a result, each of the shift-subsegments 501-503 receives compressed test response bits that are generated by unique groups of the scan chains $SC_1$-$SC_{27}$. Consequently, X-masking between the three separate shift-subsegments 501-503 within segment $S_5$ is impossible. For example, an X-masking effect that exists in shift-subsegment 501 cannot extend to the other two shift-subsegments 502-503, because the three shift-subsegments 501, 502 and 503 receive compressed test response bits from three mutually exclusive groups of scan chains.

In addition, because each of the shift-subsegments 501-503 receives k (3) compressed test response bits provided by mutually exclusive groups of scan chains, each k-bit shift-subsegment 501-503 of segment $S_5$ effectively divides the scan cells in the corresponding scan chains into k (3) sets, such that scan cells in k consecutive shift cycles belong to k different sets (in the same manner described above for segment $S_0$ of FIG. 4C). The k sets of scan cells within each of the shift-subsegments 501-503 define another partition, wherein X-masking between these k separate sets of scan cells within each of the shift-subsegments 501-503 is impossible. In the manner described above, dual-segment $S_5$ exhibits advantages associated with both shift-segments $S_0$ and hold-segments $S_1$, $S_2$ and $S_3$.

In a particular embodiment, AXC 204 is modified to include a dual-segment $S_5$ with g shift-subsegments of size k and one or more separate hold-segments (similar to hold-segments $S_1$, $S_2$ and/or $S_3$), wherein the dual-segment $S_5$ and the one or more hold-segments are dynamically unloaded per t shift cycles, where k is an odd integer greater than or equal to 3, and t≤(g*k). This configuration reduces side effects of using hold-segments while preserving other desirable properties of the AXC.

The operation of streaming LTC 100 and AXC 204 will now be compared. Let l be the length of the scan chains $SC_1$-$SC_N$ (i.e., l=the maximum number of scan cells in all scan chain), let k=4n be the number of outputs of XOR network 150/220 (e.g., k=4(3)=12 in FIGS. 4A-4C), and let so be the number of streaming outputs (e.g., so=2). For simplicity, let l mod t=0 and 2n mod so=0. The number of tester cycles per test pattern for the streaming LTC 100 of FIG. 1 is (l+4n/so) (e.g., l+6 in the example of FIG. 1). The number of tester cycles per test pattern for AXC 204 is (l+t) where t=2n/so (e.g., l+3 in the example of FIGS. 4A-4C). Note that AXC 204 needs 2n/so extra tester cycles to unload segments $S_0$ and $S_1$ per test pattern after shift operations from the scan chains $SC_1$-$SC_{27}$ are completed while LTC 100 needs 4n/so extra tester cycles per test pattern. As a result, the streaming LTC 100 needs up to two times more extra tester cycles per test pattern than AXC 204. The extra tester cycles are completely avoided if AXC 204 has enough streaming outputs to dynamically unload all segments $S_0$-$S_3$ within n shift cycles.

Figure 6:
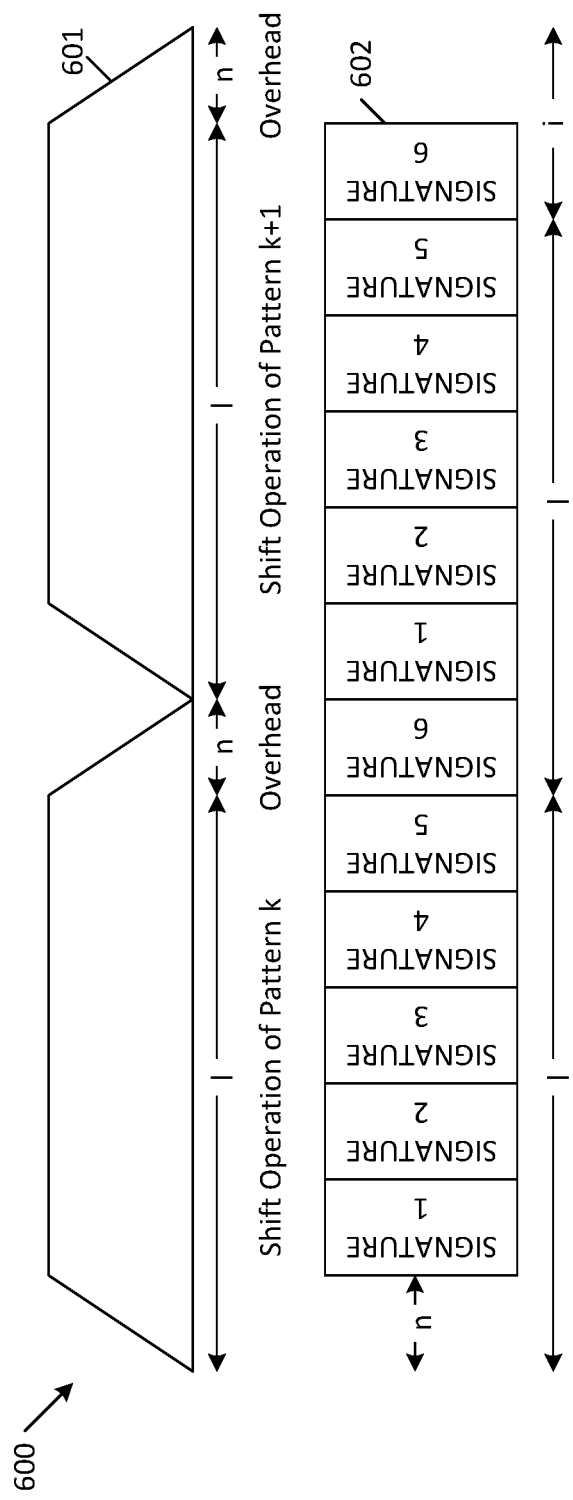
FIG. 6 is a timing diagram that shows the amount of test response bits unloaded from the streaming LTC of FIG. 1 and the augmented X-tolerant compactor FIGS. 4A-4C in accordance with one embodiment of the present invention.

FIG. 6 is a timing diagram 600 that illustrates the amount of compacted test response bits which are unloaded by streaming LTC 100 and AXC 204 when so=4. In this example, the streaming LTC 100 is modified to include four streaming outputs from four shift-segments of length n. As illustrated by waveform 601, during the first n shift cycles, the streaming LTC 100 gradually increases the number of unloaded test response bits from scan chains. For example, a compacted test response bit of the i-th shift cycle receives test response bits from i groups of scan chains coupled to i flip-flops of each segment of the streaming LTC 100, wherein i is less than or equal to n. Next, the streaming LTC 100 unloads compacted test response bits that receive test response bits from all scan chains coupled to the streaming LTC 100 until the shift operation is completed. After the shift operation is completed, the streaming LTC 100 needs n extra cycles to unload all compacted test response bits to the tester 150. As a result, the streaming LTC 100 has a lower compression ratio in the head and the tail of a test pattern.

In contrast, as illustrated by waveform 602, AXC 204 maintains the same compression ratio across the test pattern, and each dynamic signature compacts all test response bits from n consecutive shift cycles (e.g., for AXC 204 of FIG. 4C, each one of 3n=9 compacted test response bits from segments $S_1$, $S_2$ and $S_3$ receives and compacts n test response bits from one of the mutually exclusive groups of scan chains [$G_4$-$G_6$], [$G_7$-$G_9$] and [$G_{10}$-$G_{12}$], respectively, over n consecutive shift cycles. Similarly, each one of n=3 compacted test response bits from segment $S_0$ receives and compacts n test response bits from one of the mutually exclusive groups of scan chains [$G_1$-$G_3$] over n consecutive shift cycles). Next, the dynamic signature is moved into the 4n-bit serializer and is unloaded to the tester in n shift cycles (e.g., 4n=12 compacted test response bits from segments $S_0$, $S_1$, $S_2$ and $S_3$ are loaded into a 12-bit serializer, and are unloaded to the tester over n=3 shift cycles on so=4 serial channels). As a result, if AXC 204 is coupled to a 4n-bit output serializer, AXC 204 does not require any extra tester cycles to unload the compacted test response bits. This example shows that unloading AXC 204 via a serializer reduces the number of tester cycles per pattern (when compared with streaming LTC 100). This feature is advantageous and reduces test application time, which is a major contributor to test costs.

In addition, AXC-based logic diagnosis considers that all scan cells within t consecutive shift cycles that have same quotient by modulo t belong to one pseudo shift cycle. As a result, the AXC-based logic diagnosis is a bit more complex than diagnosis for linear space compactors but much simpler than streaming LTC-based and MISR-based logic diagnosis (pseudo combinational logic diagnosis). Another advantage of AXC 204 is that it provides an efficient isolation of multiple scan chain defects for scan chain diagnosis in compression mode. Conventional approach for isolation of multiple scan chain defects in compression mode requires a special set of masking test patterns for scan chain diagnosis such that each scan chain is directly observable per streaming output (see, e.g., Y. Huang, W. T. Cheng, and J. Rajski, "Compressed pattern diagnosis for scan chain failures," in Proc. ITC, pp. 751-759, 2005). In contrast, the AXC 204 considers that a pair of defective scan chains are isolated if they are coupled to different flip-flops of at least one hold-segment. As a result, the requirements for a special set of masking test patterns for isolation of multiple chain defects in compression mode are greatly relaxed in AXC 204.

Figure 7:
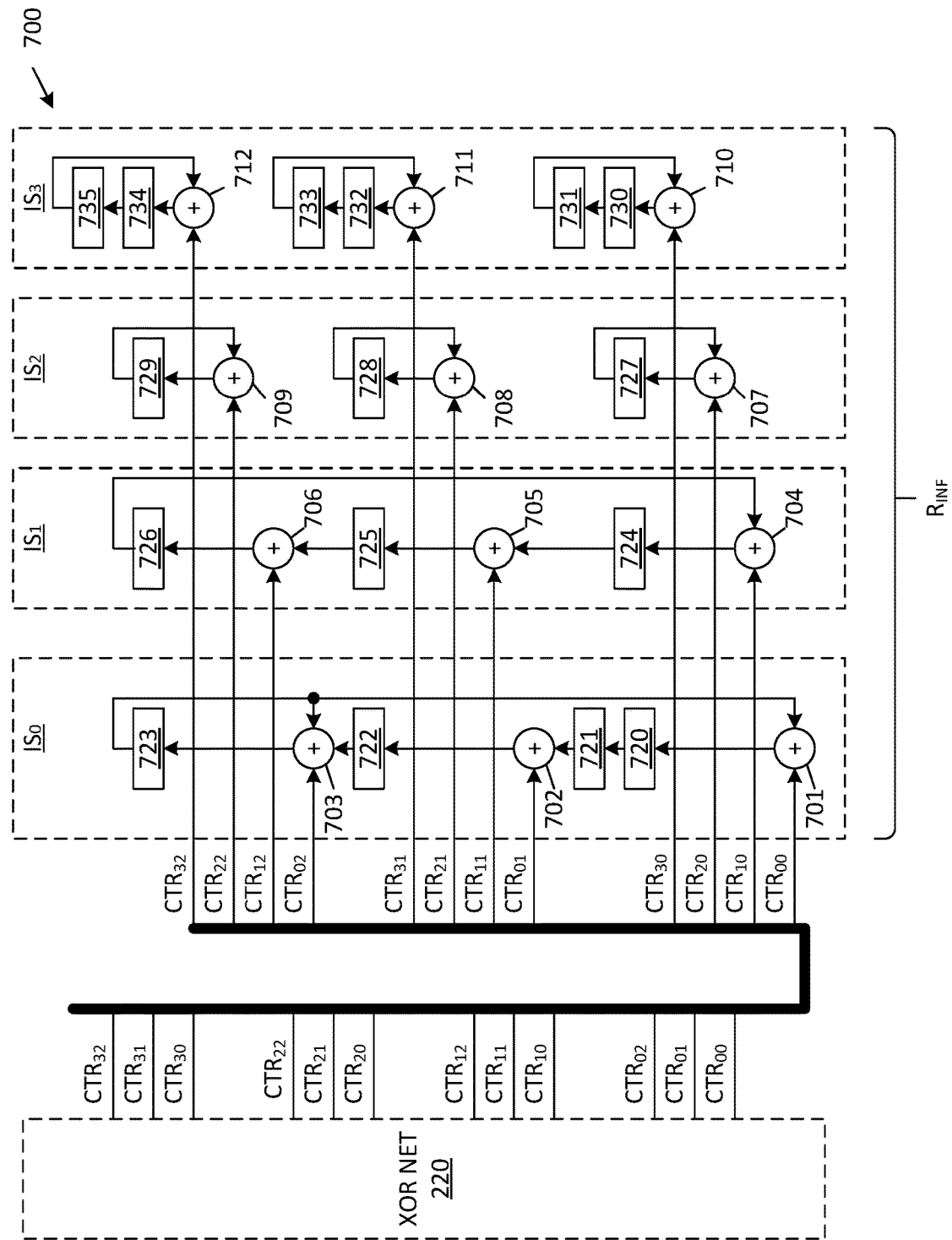
FIG. 7 is a block diagram of a register $R_{INF}$ that can be used in combination with scan chains of FIG. 4A and the XOR network of FIG. 4B in order to implement an infinite augmented X-tolerant compactor.

FIG. 7 is a block diagram of a register $R_{INF}$ that can be used in combination with scan chain coding of FIG. 4A and the XOR network 220 of FIG. 4B in order to implement an infinite AXC 700. Register $R_{INF}$, includes four segments $IS_0$, $IS_1$, $IS_2$ and $IS_3$, wherein each of these four segments is unloaded per test pattern. Register $R_{INF}$ has a configuration of AXC(k,n,an,bn), wherein k, n, an and bn represent the number of flip-flops (bits) included in segments $IS_0$, $IS_1$, $IS_2$ and $IS_3$, respectively, wherein a and b are preferably relatively prime numbers and k is determined based on the scan chain length. In the present example, a=1, b=2, n=3 and k=4.

Segment $IS_0$ of register $R_{INF}$ includes XOR gates 701, 702 and 703, which are coupled to receive n compressed test response bits $CTR_{00}$, $CTR_{01}$ and $CTR_{02}$, respectively. Segment $IS_0$ also includes k flip-flops 720-723 (which store a k-bit intermediate and final compacted test response vector), wherein flip-flops 720 and 721 are connected in series between XOR gates 701 and 702, flip-flop 722 is connected in series between XOR gates 702 and 703, and flip-flop 723 is connected in series between XOR gates 703 and 701, thereby forming a first loop. The output of flip-flop 723 is also coupled to XOR gate 703, thereby forming a second loop. Segment $IS_0$ therefore includes two overlapping feedback loops, such that the first feedback loop includes all bits of the segment $IS_0$ and the second feedback loop includes a subset of bits of the segment $IS_0$. In the illustrated example, segment $IS_0$ is a k-bit (4-bit) Galois linear feedback shift register (LFSR) with primitive polynomial $x^4+x^3+1$. Note that each X-value that enters into this LFSR will gradually X-out all bits of segment $IS_0$.

Segment $IS_1$ includes XOR gates 704, 705 and 706, which are coupled to receive n compressed test response bits $CTR_{10}$, $CTR_{11}$ and $CTR_{12}$, respectively. Segment $IS_1$ also includes n flip-flops 724-726 (which store an n-bit intermediate and final compacted test response vector), wherein flip-flop 724 is connected between XOR gates 704 and 705, flip-flop 725 is connected between XOR gates 705 and 706, and flip-flop 726 is connected between XOR gates 706 and 704, such that segment $IS_1$ is a circular multiple-input shift-register that divides scan cells in each scan chain into n groups such that scan cells in n consecutive shift cycles belong to n different sets (similar to segment $S_0$ of FIG. 4C). These n different sets of scan cells define a partition of the infinite AXC, wherein X-masking between these n different sets of scan cells within segment $IS_1$ is impossible. That is, each of the n mutually exclusive groups of scan cells is used to generate a corresponding one of the n compacted test response bits of segment $IS_1$.

Segment $IS_2$ includes XOR gates 707, 708 and 709, which are coupled to receive compressed test response bits $CTR_{20}$, $CTR_{21}$ and $CTR_{22}$, respectively. The outputs of XOR gates 707, 708 and 709 are coupled to inputs of flip-flops 727, 728 and 729, respectively. XOR gates 707, 708 and 709 also have inputs coupled to the outputs of flip-flops 727, 728 and 729, respectively. Thus, segment $IS_2$ is a hold-segment similar to segment $S_2$ (FIG. 4C). Segment $IS_2$ includes n flip-flops 727-729 (which store an n-bit intermediate and final compacted test response vector).

As described above, the compressed test response bits $CTR_{20}$, $CTR_{21}$ and $CTR_{22}$ are provided by mutually exclusive groups $G_7$, $G_8$ and $G_9$, respectively, of scan chains $SC_1$-$SC_{27}$. Thus, segment $IS_2$ divides the scan chains $SC_1$-$SC_{27}$ into n (3) groups $G_7$, $G_8$ and $G_9$ such that all scan chains in each group are coupled to the same flip-flop within segment $IS_2$ (i.e., the scan chains of group $G_7$ are coupled to flip-flop 727, the scan chains of group $G_8$ are coupled to flip-flop 728, and the scan chains of group $G_9$ are coupled to flip-flop 729). The groups $G_7$, $G_8$ and $G_9$ of segment $IS_2$ define a partition of the infinite AXC, wherein X-masking between these three mutually exclusive groups of scan chains within segment $IS_2$ is impossible. That is, each of the n mutually exclusive groups of scan cells is used to generate a corresponding one of the n compacted test response bits of segment $IS_2$.

Segment $IS_3$ includes XOR gates 710, 711 and 712, which are coupled to receive compressed test response bits $CTR_{30}$, $CTR_{31}$ and $CTR_{32}$, respectively. Flip-flops 730 and 731 are connected in series between the output of XOR gate 710 and an input of XOR gate 710. Flip-flops 732 and 733 are connected in series between the output of XOR gate 711 and an input of XOR gate 711. Flip-flops 734 and 735 are connected in series between the output of XOR gate 712 and an input of XOR gate 712. Thus, segment $IS_3$ is a hold-segment. Stated another way, hold-segment $IS_3$ includes n separate single-input shift-registers of length 2 (wherein XOR gate 710 and flip-flops 730-731 form a first single-input shift-register, XOR gate 711 and flip-flops 732-733 form a second single-input shift-register, and XOR gate 712 and flip-flops 734-735 form a third single-input shift-regis-ter). Segment $IS_3$ includes 2n flip-flops 730-735 (which store a 2n-bit intermediate and final compacted test response vector).

As described above, the compressed test response bits $CTR_{30}$, $CTR_{31}$ and $CTR_{32}$ are provided by mutually exclusive groups $G_{10}$, $G_{11}$ and $G_{12}$, respectively, of scan chains $SC_1$-$SC_{27}$. Thus, segment $IS_3$ divides the scan chains $SC_1$-$SC_{27}$ into n (3) groups $G_{10}$, $G_{11}$ and $G_{12}$ such that all scan chains in each group are coupled to the same flip-flops within segment $S_3$ (i.e., the scan chains of group $G_{10}$ are coupled to flip-flops 730-731, the scan chains of group $G_{11}$ are coupled to flip-flops 732-733, and the scan chains of group $G_{12}$ are coupled to flip-flops 734-735). The groups $G_{10}$, $G_{11}$ and $G_{11}$ of segment $IS_3$ define a partition of the infinite AXC, wherein X-masking between these three mutually exclusive groups of scan chains within segment $IS_3$ is impossible. That is, each of the n mutually exclusive groups of scan chains is used to generate a corresponding pair of the 2n compacted test response bits of segment $IS_3$.

Note that the infinite AXC 700 specified by register $R_{INF}$ has a length of 4n+k (16) and each scan cell has a unique erroneous signature for up to $n^3$ scan chains of length equal to the period of the k-bit LFSR of segment $IS_0$.

Figure 8A:
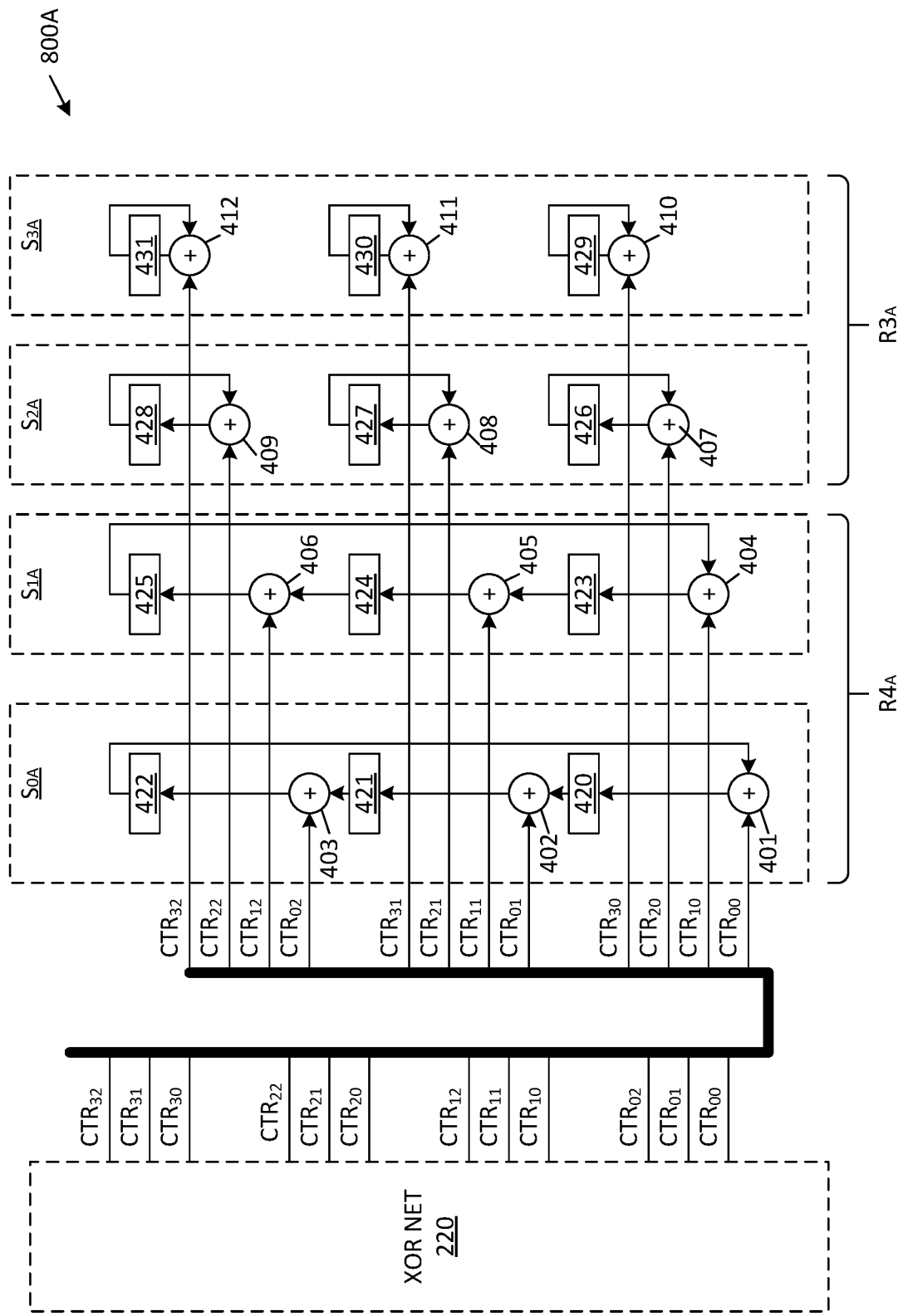
FIG. 8A is a block diagram illustrating register sets that are configured to implement a finite AXC in accordance with one embodiment of the present invention.
Figure 8B:
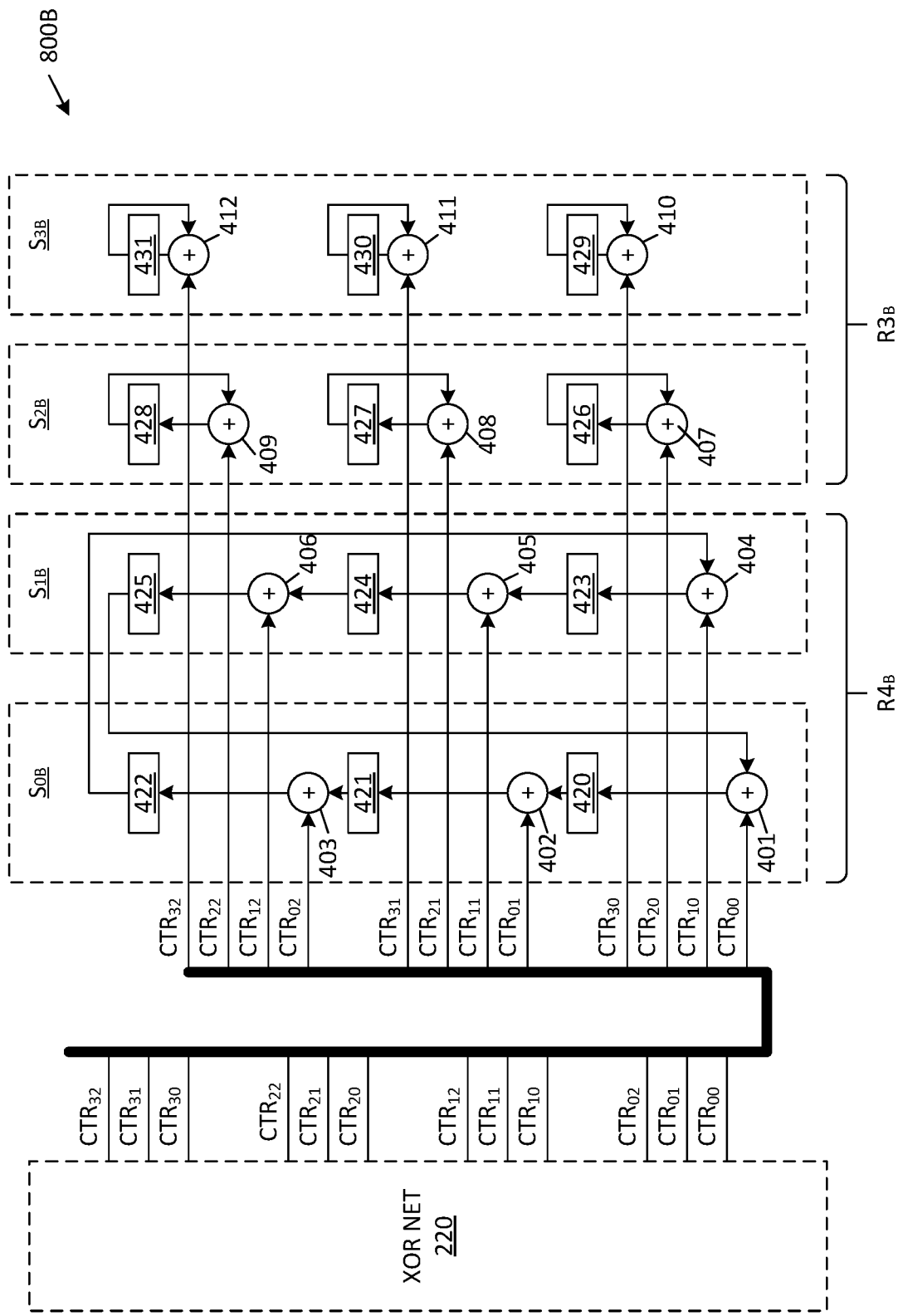
FIG. 8B is a block diagram illustrating register sets that are configured to implement a finite AXC in accordance with one embodiment of the present invention.
Figure 8C:
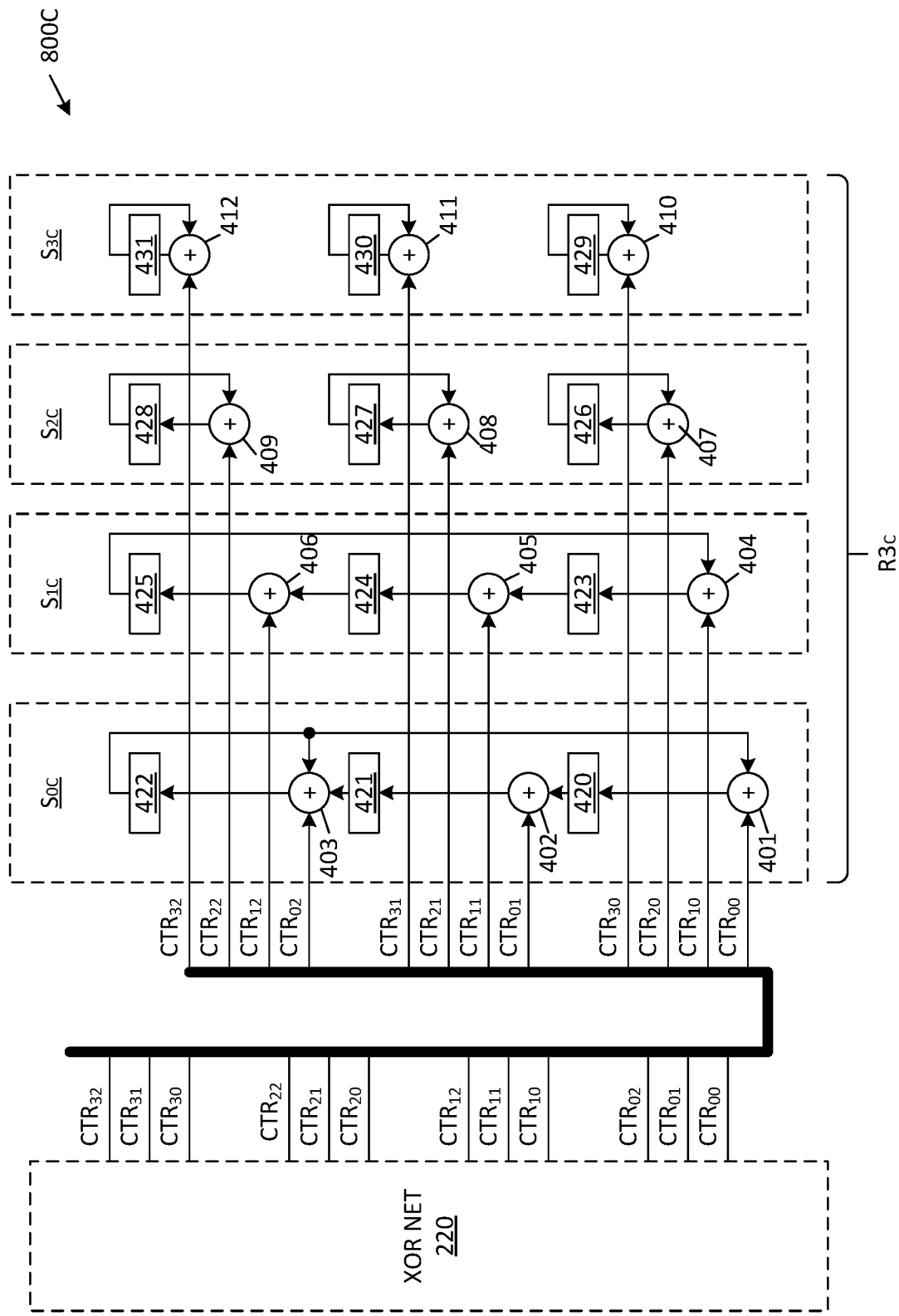
FIG. 8C is a block diagram illustrating register sets that are configured to implement an infinite AXC in accordance with one embodiment of the present invention.

FIGS. 8A, 8B and 8C are block diagrams of register sets $R3_A$-$R4_A$, $R3_B$-$R4_B$ and $R3_C$, respectively, that can be used in combination with scan chain coding of FIG. 4A and the XOR network 220 of FIG. 4B in order to operate AXC 204 in three different configurations. As described in more detail below, register sets $R3_A$-$R4_A$, $R3_B$-$R4_B$ and $R3_C$ can be created by reconfiguring the routing between XOR gates 401-412 and flip-flops 420-430 of segments $S_0$-$S_3$ (FIG. 4C).

FIG. 8A illustrates register sets $R3_A$ and $R4_A$, which are configured to implement a finite AXC 800A. Register $R4_A$ includes segments $S_{0A}$ and $S_{1A}$, which are unloaded per test pattern. Register $R3_A$ includes segments $S_{2A}$ and $S_{3A}$, which are unloaded per n (3) shift cycles. Segment $S_{0A}$ is configured as a circular multiple-input shift-register, in the same manner described above for segment $S_0$ (FIG. 4C). Segment $S_{1A}$ is also configured as a circular multiple-input shift-register, in the same manner as segment $S_{0A}$. Note that switching the configuration of segment $S_1$ (FIG. 4C) to the configuration of segment $S_{1A}$ (FIG. 8A) involves removing the connections from the outputs of flip-flops 423, 424 and 425 to the inputs of XOR gates 404, 405 and 406, respectively, and adding a connection from the output of flip-flop 425 to the input of XOR gate 404. Segment $S_{2A}$ is configured as n single-input shift-registers of length 1, in the same manner described above for segment $S_2$. Segment $S_{3A}$ is configured as n single-input shift-registers, in the same manner described above for segment $S_3$. The configuration of AXC 800A exhibits a reduced X-masking effect and supports isolation of scan chains and isolation of shift cycles in a manner similar to that described above in connection with FIGS. 4A-4C.

FIG. 8B illustrates register sets $R3_B$ and $R4_B$, which are configured to implement a finite AXC 800B. Register $R4_B$ includes segments $S_{0B}$ and $S_{1B}$, which are dynamically unloaded per t shift cycles. Register $R3_B$ includes segments $S_{2B}$ and $S_{3B}$, which are unloaded per test pattern. Segments $S_{0B}$ and $S_{1B}$ are configured as a circular 2n-bit multiple-input shift-register. Note that switching from the configuration of segments $S_0$-$S_1$ (FIG. 4C) to the configuration of segments $S_{0B}$-$S_{1B}$ (FIG. 8B) involves removing the connections from the outputs of flip-flops 422, 423, 424 and 425 to the inputs of XOR gates 401, 404, 405 and 406, respectively, and adding connections from outputs of flip-flops 422 and 425 to inputs of XOR gates 404 and 401, respectively. Segment $S_{2B}$ is configured as n single-input shift-registers of length 1, in the same manner described above for segment $S_2$. Segment $S_{3B}$ is configured as n single-input shift-registers, in the same manner described above for segment $S_3$. The configuration of finite AXC 800B advantageously enables a direct observation for each scan chain per streaming output. This feature requires a selector 215 such that at most so scan chains are selected for observation wherein so is the number of streaming outputs. All other scan chains are masked.

FIG. 8C illustrates register set $R3_C$, which is configured to implement an infinite AXC 800C. Register $R3_C$ includes segments $S_{0C}$, $S_{1C}$, $S_{2C}$ and $S_{3C}$, which are unloaded per test pattern. Segment $S_{0C}$ is configured as a linear feedback shift-register, such that segment $S_{0C}$ has more than one feedback loop. Note that switching from the configuration of segment $S_0$ (FIG. 4C) to the configuration of segment $S_{0C}$ (FIG. 8C) involves providing a connection from the output of flip-flop 422 to an input of XOR gate 403. Segment Sic is configured as a circular multiple-input shift-register, in the same manner as segment $S_{1A}$ (FIG. 8A). Segment $S_{2A}$ is configured as n single-input shift-registers of length 1, in the same manner described above for segment $S_2$. Segment $S_{3A}$ is configured as n single-input shift-registers of length 1, in the same manner described above for segment $S_3$.

The examples of FIGS. 8A-8C (and FIGS. 4A-4C) illustrates the construction of a multi-purpose reconfigurable AXC that supports efficient testing, diagnosis and debugging for both manufacturing test (e.g., finite AXCs 400, 800A, 800B) and in-system test (e.g., infinite AXC 800C). A defining feature of each of these AXCs is the presence of both a shift-segment and a hold-segment.

FIG. 9 is a table 900 that specifies fourteen configurations C1-C14, including thirty-one DFTMAX Ultra benchmark designs (see, https://www.synopsys.com/implementation-and-signoff/test-automation.html) with up to 970K scan cells. These benchmark designs were used for validation of the AXC embodiments described herein. The reported experimental data are based on two streaming outputs. The presented data also includes the number of designs for each configuration (#designs), the number of scan chains for each configuration (#chains), the length of the scan chains for each configuraton (Len. of chains), the number of flip-flops of the original streaming LTC (Len. of LTC), the compression ratio of the streaming LTC which is calculated as a ratio between the number of test response bits to the number of compacted test response bits (Comp. ratio), the number of compacted test response bits per test pattern (#test response bits), and the number of tester cycles per test pattern of the streaming LTC that is equal to the length of scan chains plus the number of shift cycles to unload the static signature using 2 streaming outputs (Cycles per pattern).

Figure 10:
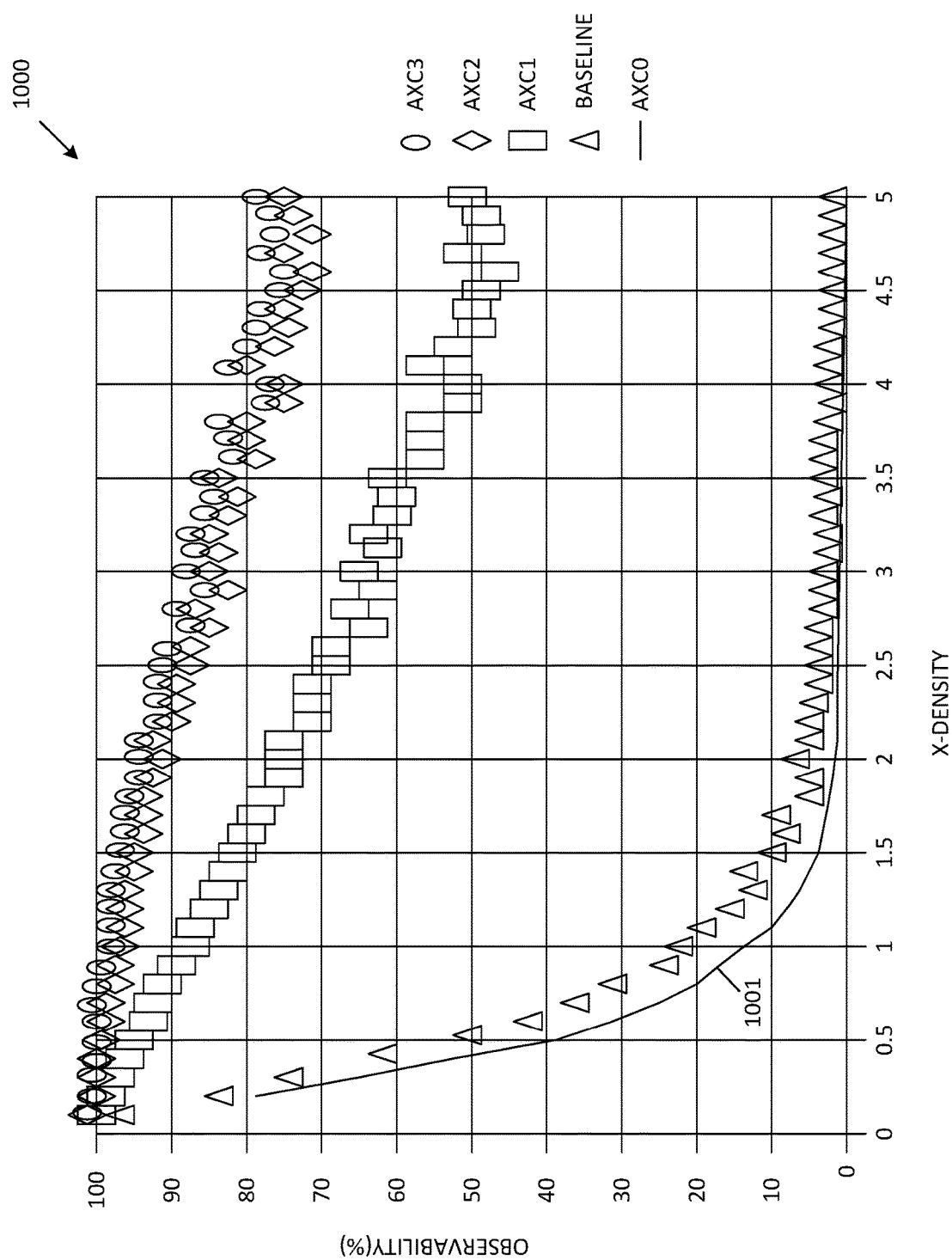
FIG. 10 is a graph that illustrates the percent observability of the finite AXC based on thirty-one benchmark designs of FIG. 9 as a function of X-density and the number of hold-segments of the finite AXC.

FIG. 10 is a graph 1000 that shows average unweighted observability (as a percentage) across all benchmark designs of table 900 as a function of X-density where the X-density is calculated as a ratio between the number of X-values in the test response bits and the number of compacted test response bits. For example, if a test response includes 3000 X-values and the number of compacted test response bits is 1000, then the X-density is 3. The observability is calculated as an unweighted average for 1000 test patterns across all designs based on the original scan chains. Experimental results include an original bidirectional streaming LTC (e.g., similar to streaming LTC 100, but allowing for shifting compacted test response data in two opposing directions within the MISRs 160) (labeled as a baseline, with results shown as triangles in graph 1000) wherein for the bidirectional streaming LTC the observability is calculated for each direction and the higher observability is reported. Experimental results also include four variations of the above-described AXC 204, labeled as AXC3, AXC2, AXC1 and AXC0, wherein AXC3 has three hold-segments $S_1$, $S_2$ and $S_3$ such that hold-segments $S_2$ and $S_3$ are dynamically unloaded (see, e.g., FIG. 4C), AXC2 has two hold-segments $S_2$ and $S_3$ that are dynamically unloaded (see, e.g., FIG. 8B), AXC1 has one hold-segment $S_2$ that is dynamically unloaded and AXC0 has four shift-segments and no hold-segments. The results for AXC3, AXC2 and AXC1 are shown as ovals, diamonds and rectangles, respectively in graph 1000. Results for AXC0 are shown as line 1001 in graph 1000. Graph 1000 shows that the observability is proportional to the number of hold-segments of the AXC. The observability of X-values is greatly improved by adding at least one hold-segment that is dynamically unloaded.

Figure 11:
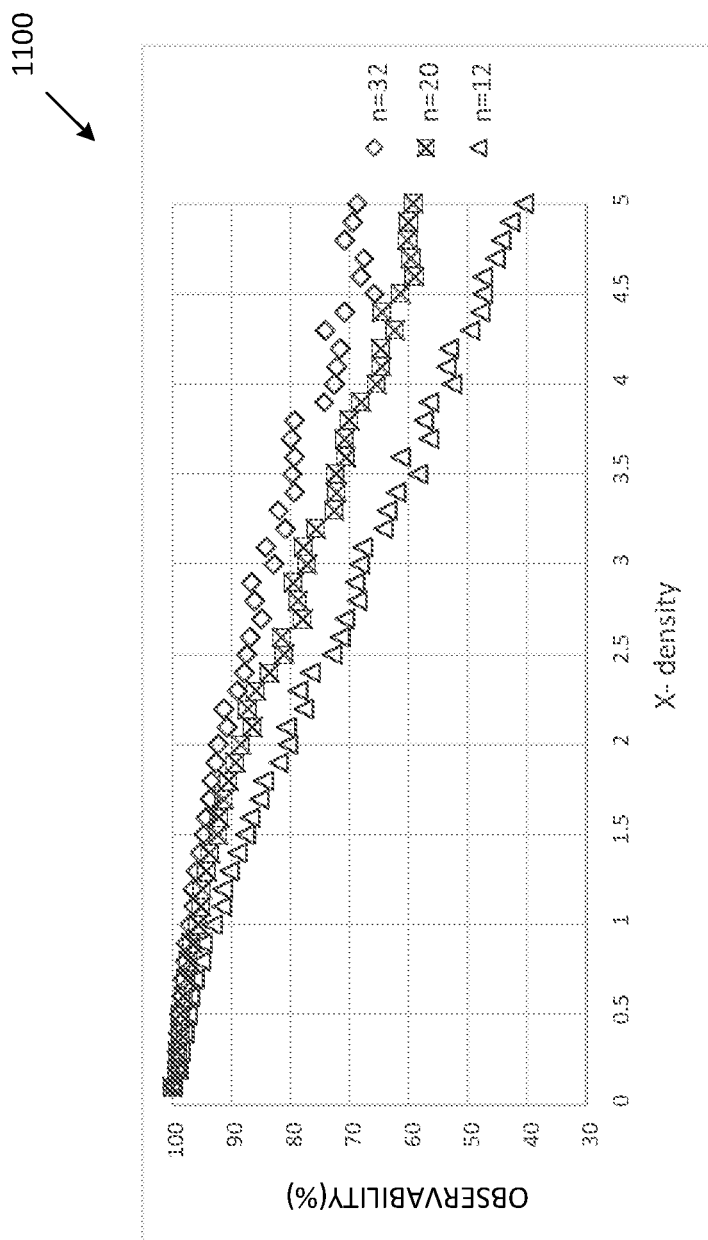
FIG. 11 is a graph that illustrates the percent observability of the finite AXC based on thirty-one benchmark designs of FIG. 9 as a function of X-density and the length of hold-segments of the finite AXC.

FIG. 11 is a graph 1100 that shows average unweighted observability (as a percentage) across all design configurations of table 900 as a function of the X-density for three values of the parameter n, namely n=12, n=20 and n=32, (using the AXC2 variation specified by FIG. 10). Graph 1100 shows that the observability is proportional to the length of the segments as defined by parameter n. In summary, experimental results show that the proposed AXC2 maintains a much higher observability than the streaming LTC over a wide range of X-density. In this sense, reducing X-masking effect increases the number of observable scan cells as well as reduces the number of X-values that need to be eliminated for fault detection. Both factors have a significant impact on the number of test patterns and test quality for designs with X-values and high compression ratios. As a result, the AXC of the present invention supports aggressive test compression and efficient dynamic compaction.

Figure 12:
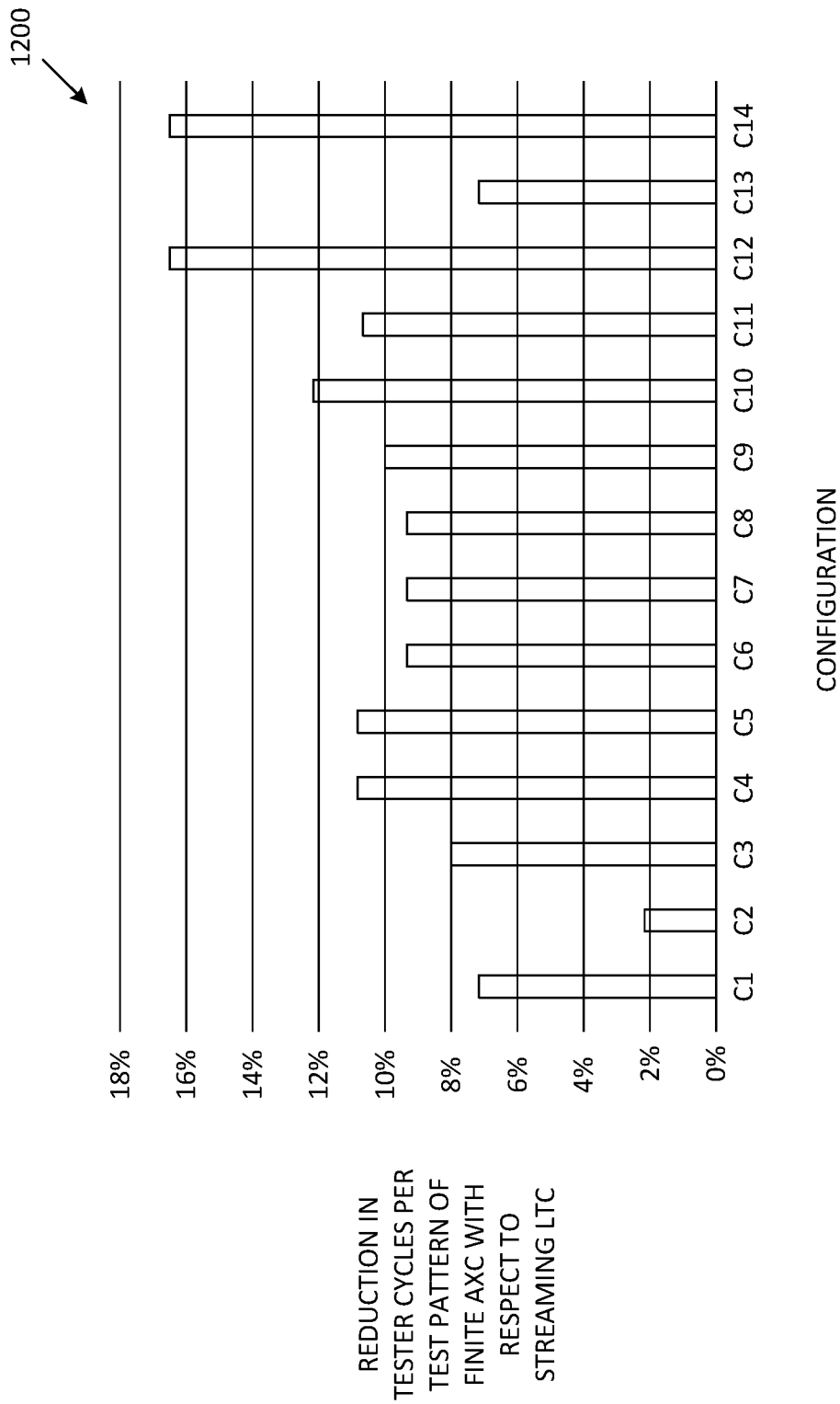
FIG. 12 is a graph illustrating the percent reduction of the number of tester cycles per test pattern of the finite AXC designs of FIG. 9, when compared to a conventional streaming LTC.

FIG. 12 is a graph 1200 that shows the reduction in the number of tester cycles per test pattern based on a finite AXC based on the minimum length of scan chains for each configuration (versus original streaming LTC 100). This data reflects time or number of tester cycles for unloading compacted test response bits through an output serializer under the assumption that both LTCs have same number of flip-flops. As illustrated, the finite AXC of the present invention achieves up to 16.67 percent reduction in the number of tester cycles with respect to the original streaming LTC. For configuration C12, the streaming LTC and the finite AXC need 138 and 69 extra tester cycles, respectively, per test pattern to unload the compacted test response bits using two streaming outputs.

Figure 13:
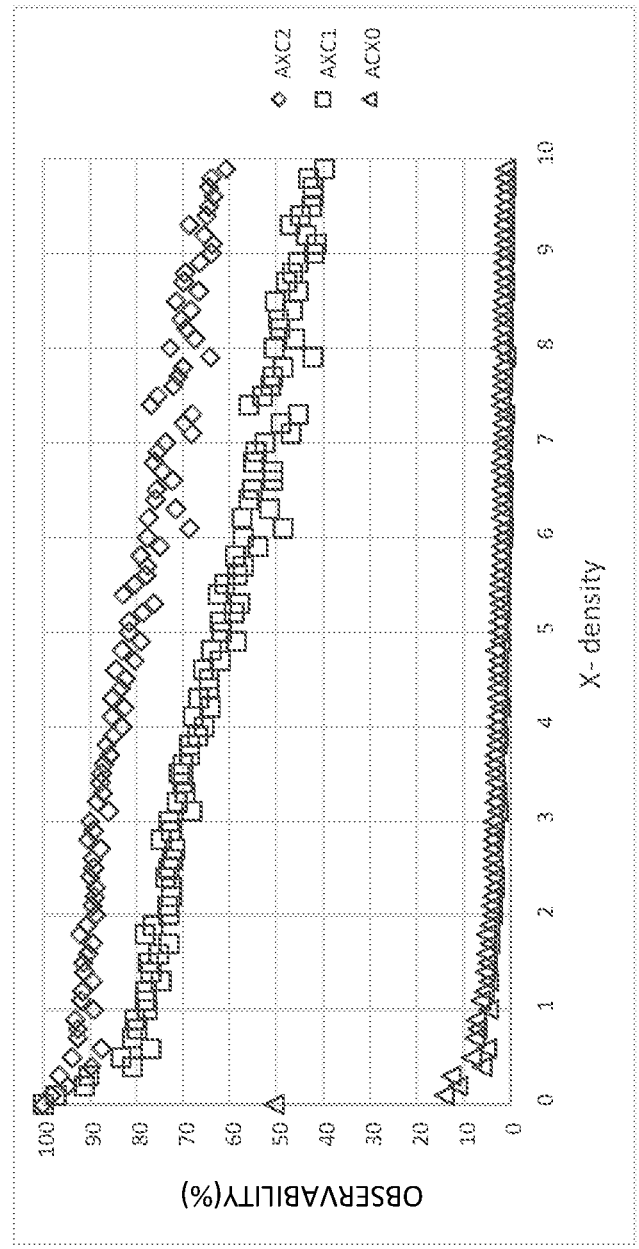
FIG. 13 is a graph illustrating the percent observability of the infinite AXC based on thirty-one benchmark designs of FIG. 9 as a function of X-density and the number of hold-segments of the infinite AXC.

FIG. 13 is a graph 1300 that shows an average unweighted observability across all benchmark designs for three values of the number of hold-segments of the infinite AXC 700 as a function of X-density where each dot represents data from all benchmark designs and parameters of the infinite AXC 700 are determined based on the length of scan chains and the length of LTC from table 900. More formally, if the length of the original streaming LTC in table 900 is equal to L, then the length of infinite AXC 700 is L also, and this rule is valid for all reported experimental data.

The augmented test architecture (ATA) 200 was validated based on six real DFTMAX designs (up to 2.5M scan cells and up to 2 percent X-values). Experimental results for four levels of test data compression are based on the following assumptions: 1) ATA 200 and DFTMAX have the same number of streaming inputs and streaming outputs; and 2) DFTMAX with an N-to-1 serializer needs N tester cycles to receive input test data per shift cycles while the ATA 200 needs one tester cycle per shift cycle. As a result, DFTMAX with an N-to-1 serializer needs N times more tester cycles per test pattern than DFTMAX to receive the same input test data. The ATA 200 has about N times higher compression ratio than DFTMAX with an N-to-1 serializer. Table 1 shows results at the input side of ATA 200 based on an assumption that all scan chains are directly observable, i.e., without test response compaction. The presented data includes test application time reduction (TATR), CPU time ratios and differences in test coverage. Table 1 shows that the augmented decompressor (ADC) 202 achieves 1.19× TATR and 46 percent CPU time reduction with respect to DFTMAX. The ADC 202 achieves 1.95× TATR and 14 percent CPU time reduction with respect to DFTMAX with a 2-to-1 serializer. The ADC 202 achieves 2.60X TATR based on 24 percent CPU time overhead with respect to DFTMAX with a 3-to-1 serializer. The ADC 202 achieves 3.09X TATR based on 65 percent CPU time overhead with respect to DFTMAX with a 4-to-1 serializer. The ADC 202 achieves the same or better test coverage than the DFTMAX. These results demonstrate that the input side of the ATA 200 supports a 4× increase in compression ratio with respect to DFTMAX.

TABLE 1

|  | TATR | CPU Time Ratio | Δ test coverage, % |
|---|---|---|---|
| DFTMAX without serializer | 1.19 | 0.54 | +0.04 |
| DFTMAX 2-to-1 serializer | 1.95 | 0.86 | +0.03 |
| DFTMAX 3-to-1 serializer | 2.60 | 1.24 | +0.05 |
| DFTMAX 4-to-1 serializer | 3.09 | 1.65 | +0.05 |

Table 2 shows results for the ATA 200 with test response compaction and comparison with Table 1. The TATR is slightly improved for low compression ratios and is slightly degraded for high compression ratios. The CPU time is slightly reduced for all compression ratios. Test coverage has a minor degradation for high compression ratios. This indicates that the output side of ATA 200 outperforms the input side for low compression ratios but it is losing steam for high compression ratios. The performed experiment demonstrates that the proposed AXC 204 supports 4× increase in compression ratio with respect to DFTMAX.

TABLE 2

|  | TATR | CPU Time Ratio | Δ test coverage, % |
|---|---|---|---|
| DFTMAX without serializer | 1.26 (+0.07) | 0.49 (−0.05) | +0.04 (+0.00) |
| DFTMAX 2-to-1 serializer | 1.98 (+0.03) | 0.77 (−0.09) | +0.04 (+0.01) |
| DFTMAX 3-to-1 serializer | 2.54 (−0.06) | 1.11 (−0.13) | +0.04 (−0.01) |
| DFTMAX 4-to-1 serializer | 3.00 (−0.09) | 1.51 (−0.14) | +0.04 (−0.01) |

The experimental data in Tables 1 and 2 demonstrate that AXC 204 provides an efficient solution for the output side test data volume. In summary, the AXC 204 was able to avoid degradation in TATR and test coverage when increasing test compression 2×, 3× and 4× for 6 real designs.

DETAILED DESCRIPTION—TECHNOLOGY SUPPORT

General Computer Explanation

Figure 14A:
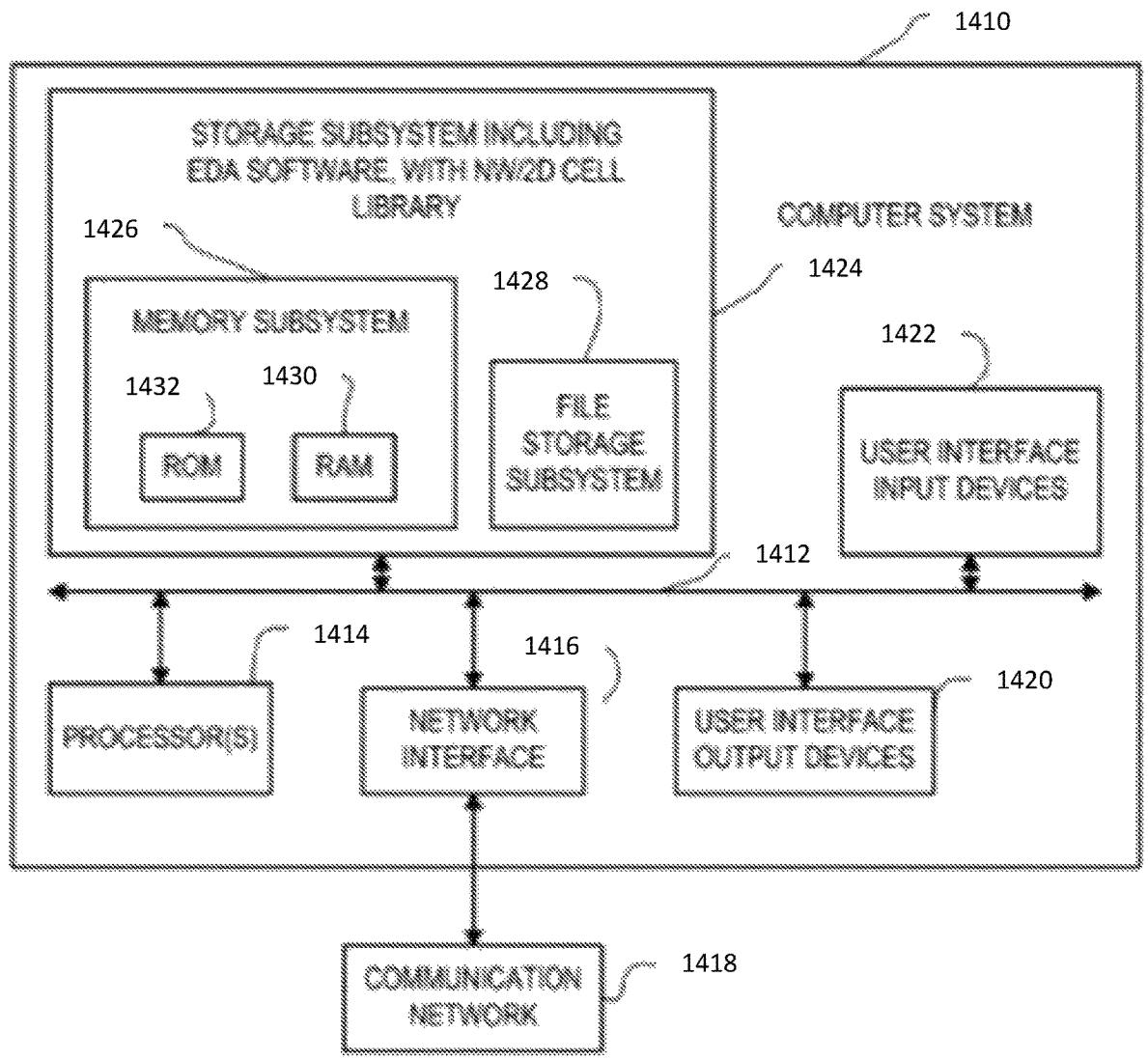
FIGS. 14A, 14B and 14C depict simplified block diagrams of a computer system suitable for use with embodiments of the technology, as well as circuit design and circuit embodiments of the technology.
Figure 14C:
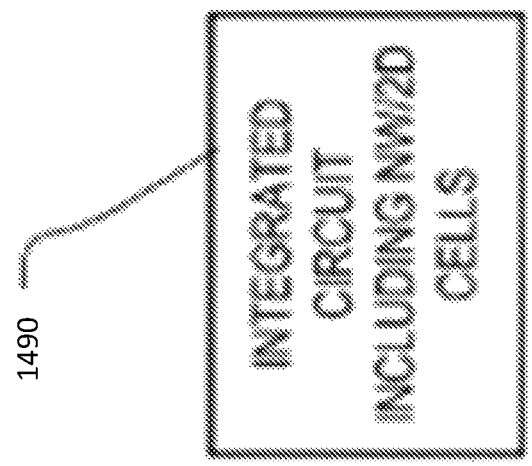
Figure 14B:
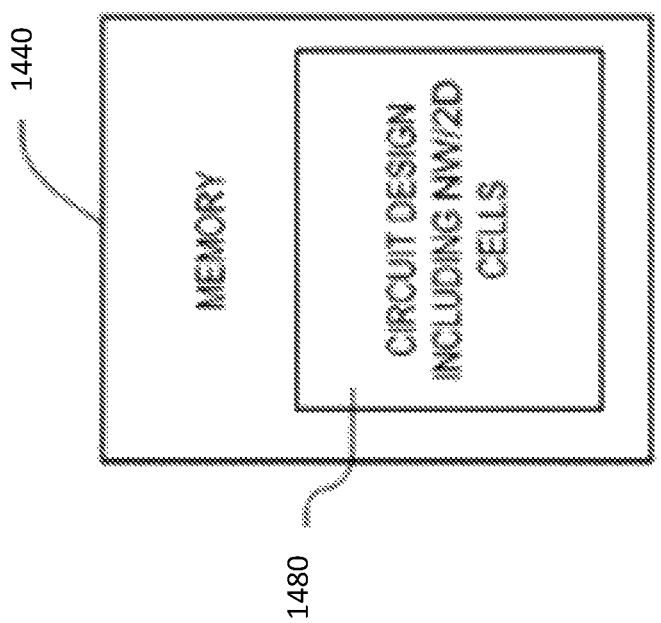

FIGS. 14A, 14B and 14C are simplified block diagrams of a computer system suitable for use with embodiments of the technology, as well as circuit design and circuit embodiments of the technology.

In FIG. 14A, computer system 1410 typically includes at least one computer or processor 1414 which communicates with a number of peripheral devices via bus subsystem 1412. Typically, the computer can include, or the processor can be, any of a microprocessor, graphics processing unit, or digital signal processor, and their electronic processing equivalents, such as an Application Specific Integrated Circuit (AS1C) or Field Programmable Gate Array (FPGA). The terms 'processor' and 'computer' are further defined below. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 1410 depicted in FIG. 14A is intended only as one example for purposes of illustrating the preferred embodiments. Many other configurations of computer system 1410 are possible having more or less components than the computer system depicted in FIG. 14A.

Network interface subsystem 1416 provides an interface to outside networks, including an interface to communication network 1418, and is coupled via communication network 1418 to corresponding interface devices in other computer systems or machines. Communication network 1418 may comprise many interconnected computer systems, machines and communication links. These communication links may be wireline links, optical links, wireless links, or any other devices for communication of information. Communication network 1418 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1422 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 1410 or onto communication network 1418. User interface input devices typically allow a user to select objects, icons, text and the like that appear on some types of user interface output devices, for example, a display subsystem.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 1410 to the user or to another machine or computer system.

Memory subsystem 1426 typically includes a number of memories including a main random-access memory (RAM) 1430 (or other volatile storage device) for storage of instructions and data during program execution and a read only memory (ROM) 1432 in which fixed instructions are stored. File storage subsystem 1428 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1428.

Bus subsystem 1412 provides a device for letting the various components and subsystems of computer system 1410 communicate with each other as intended. Although bus subsystem 1412 is shown schematically as a single bus, alternative embodiments of the bus subsystem may use multiple busses. For example, RAM-based main memory can communicate directly with file storage systems using Direct Memory Access (DMA) systems.

FIG. 14B depicts a memory 1440 such as a non-transitory, computer readable data and information storage medium associated with file storage subsystem 1428, and/or with network interface subsystem 1416, and can include a data structure specifying a circuit design. The memory 1440 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 14C signifies an integrated circuit 1490 created with the described technology that includes one or more cells selected, for example, from a cell library.

DETAILED DESCRIPTION—TECHNOLOGY SUPPORT

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured AS1C). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs for example, sold by Xilinx or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT

EDA System/Workflow Explanation

Figure 15:
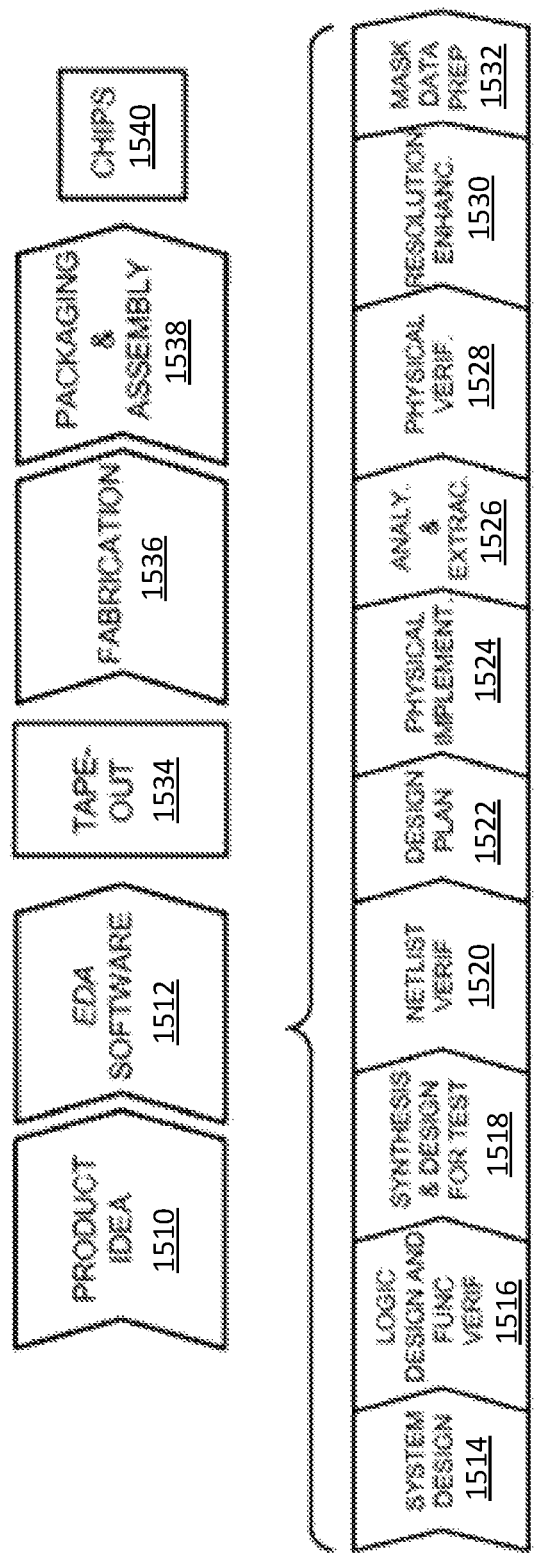
FIG. 15 depicts a flowchart of various operations in the design and fabrication of an integrated circuit in accordance with an embodiment of the present disclosure

FIG. 15 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 1510 with information supplied by a designer, information which is transformed during a process to create an item of manufacture (referred to herein as a design or device) that uses an EDA software tool 1512, which may also be signified herein as EDA software, as a design tool, or a verification tool. When the design is finalized, it can be taped-out 1534, which typically is when artwork (e.g., geometric patterns) for the integrated circuit is sent to a fabrication facility to manufacture the mask set, which is then used to manufacture the integrated circuit. After tape-out, a semiconductor die is fabricated 1536 and packaging and assembly processes 1538 are performed, which result in the finished integrated circuit 1540 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 1512 includes processes 1514-1532, which are described below. This design flow description is for illustration purposes only and is not meant to limit the present disclosure. For example, an actual integrated circuit design may require a designer to perform the design operations in a different sequence than the sequence described herein.

During system design 1514, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 1516, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 1518, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 1520, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 1522, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 1524, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 1526, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 1528, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 1530, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 1532, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 1512.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—TECHNOLOGY SUPPORT

Emulation Environment Explanation

Figure 16:
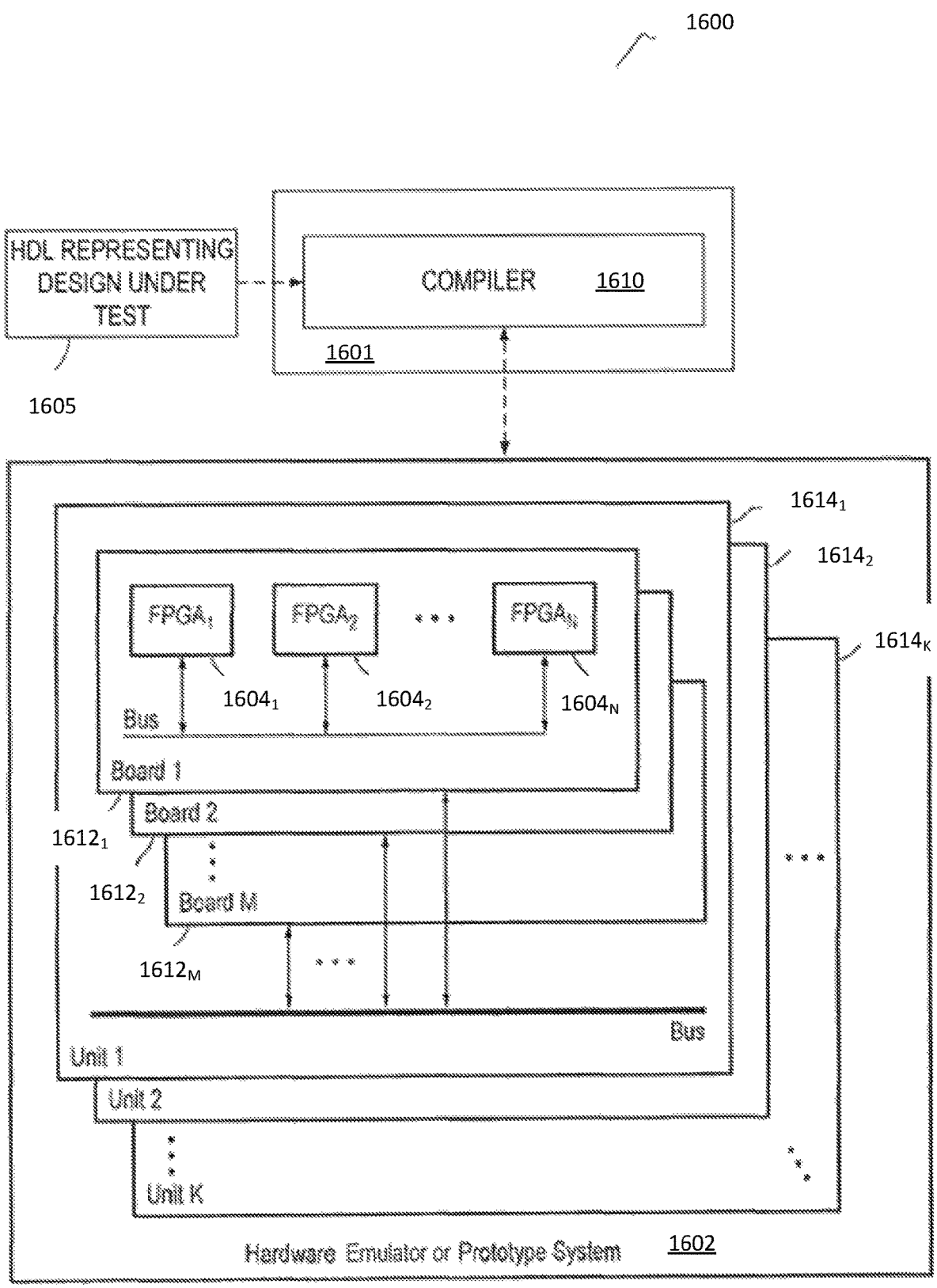
FIG. 16 depicts a block diagram of an emulation system.

An EDA software system, such as element 1512 depicted in FIG. 15, typically includes an emulation system 1516 to verify the functionality of the circuit design. FIG. 16 depicts a typical emulation system which includes a host computer system 1601 (often part of an EDA system) and an emulator system 1602 (typically a set of programmable devices such as Field Programmable Gate Arrays (FPGAs)). The host system generates data and information, typically using a compiler 1610, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBu Server available from Synopsys, Inc.

The host system 1601 comprises one or more processors. In the embodiment where the host system is comprised of multiple processors, the functions described herein as being performed by the host system may be distributed among the multiple processors.

The host system 1601 typically includes a compiler 1610 that processes code written in a hardware description language that represents a DUT, producing data (typically binary) and information that is used to configure the emulation system 1602 to emulate the DUT. The compiler 1610 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1604_1$ to $1604_N$ in FIG. 16. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1604_1$-$1604_N$ may be placed into one or more hardware boards $1612_1$ through $1612m$. Many of such boards may be placed into a hardware unit, e.g. $1614_1$. The boards within a unit may be connected using the backplane of the unit or any other types of connections. In addition, multiple hardware units (e.g., $1614_1$ through $1614_K$) may be connected to each other by cables or any other means to form a multi-unit system. In general, the hardware emulation or prototype system 1602 may be formed using a single board, a single unit with multiple boards, or with multiple units without departing from the teachings of the present disclosure.

For a DUT that is to be emulated, the emulator receives from the host system one or more bit files including a description of the DUT The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system receives (e.g., from a user or from a data store) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven subsystems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT If the description of the DUT is fully or partially in HDL (e.g., RTL or other level of abstraction), the design synthesizer 1610 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized AS1C.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—SEMANTIC SUPPORT

The signifier 'commercial solution' signifies, solely for the following paragraph, an engineering domain-specific (and thus non preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

We claim:

1. A more efficient/useful electronic structure for circuit design, testing and/or manufacturing, comprising:
   a plurality of scan chains, each storing a corresponding plurality of test response bits, which are output over a corresponding plurality of shift cycles;
   a compactor that provides compressed test response bits in response to the test response bits provided by the plurality of scan chains during each of shift cycle,
   wherein the compressed test response bits include a first plurality of compressed test response bits, each generated in response to test response bits provided by a corresponding group of a first plurality of groups of the scan chains, and
   wherein the compressed test response bits include a second plurality of compressed test response bits, each generated in response to test response bits provided by a corresponding group of a second plurality of groups of the scan chains;
   a shift-segment including a multiple-input shift-register that receives and combines the first plurality of compressed test response bits received over a first plurality of shift cycles, thereby creating a first compacted test response vector; and
   a hold-segment including a plurality of single-input shift-registers, each receiving and combining a corresponding one of the second plurality of compressed test response bits received over a second plurality of shift cycles, thereby creating a second compacted test response vector.

2. The structure of claim 1, wherein the compactor comprises an array of exclusive OR gates.

3. The structure of claim 1, wherein the first plurality of groups of the scan chains are different than the second plurality of groups of the scan chains.

4. The structure of claim 1, wherein the shift-segment comprises:
   a plurality of logic gates, each having a first input coupled to receive a corresponding one of the first plurality of compressed test response bits; and
   a plurality of flip-flops, each having an input coupled to an output of a corresponding one of the plurality of logic gates, and an output coupled to a second input of another corresponding one of the plurality of logic gates.

5. The structure of claim 4, wherein the plurality of logic gates comprises exclusive OR gates.

6. The structure of claim 1, wherein the multiple-input shift-register of the shift-segment comprises one and only one feedback loop.

7. The structure of claim 1, wherein the multiple-input shift-register of the shift-segment comprises multiple feedback loops.

8. The structure of claim 1, wherein the hold-segment comprises:
   a plurality of logic gates, each having a first input coupled to receive a corresponding one of the second plurality of compressed test response bits; and
   a plurality of flip-flops, each having an input coupled to a corresponding one of the plurality of logic gates, and an output coupled to a second input of the corresponding one of the plurality of logic gates.

9. The structure of claim 8, wherein the plurality of logic gates comprises exclusive OR gates.

10. The structure of claim 1, further comprising an output serializer coupled to the shift-segment and the hold-segment, wherein the shift-segment is unloaded to the output serializer once per test pattern of the test response bits, and the hold-segment is unloaded to the output serializer multiple times per test pattern.

11. The structure of claim 1, wherein the first plurality of shift cycles is greater than the second plurality of shift cycles.

12. The structure of claim 1, wherein the first plurality of shift cycles is equal to the second plurality of shift cycles.

13. The structure of claim 1, wherein the compressed test response bits further include a third plurality of compressed test response bits, each generated in response to test response bits provided by a corresponding group of a third plurality of groups of the scan chains, the structure further comprising:
   a second hold-segment including a second plurality of single-input shift-registers, each receiving and combining a corresponding one of the third plurality of compressed test response bits received over a third plurality of shift cycles, thereby creating a third compacted test response vector.

14. The structure of claim 13, wherein the first plurality of shift cycles is equal to the second plurality of shift cycles, and the third plurality of shift cycles is different than the first plurality of shift cycles and the second plurality of shift cycles.

15. The structure of claim 14, wherein the second plurality of shift cycles is equal to the third plurality of shift cycles, and the first plurality of shift cycles is different than the second plurality of shift cycles and the third plurality of shift cycles.

16. The structure of claim 13, wherein the second plurality of groups of scan chains are mutually exclusive, and the third plurality of groups of scan chains are mutually exclusive.

17. The structure of claim 13, wherein the second plurality of shift cycles are consecutive shift cycles, and the third plurality of shift cycles are consecutive shift cycles.

18. The structure of claim 13, wherein the compressed test response bits further include a fourth plurality of compressed test response bits, each generated in response to test response bits provided by a corresponding group of a fourth plurality of groups of the scan chains, the structure further comprising:
   a third hold-segment including a third plurality of single-input shift-registers, each receiving and combining a corresponding one of the fourth plurality of compressed test response bits received over a fourth plurality of shift cycles, thereby creating a fourth compacted test response vector.

19. The structure of claim 18, wherein the second plurality of groups of scan chains are mutually exclusive, the third plurality of groups of scan chains are mutually exclusive, and the fourth plurality of groups of scan chains are mutually exclusive.

20. The structure of claim 18, wherein the second plurality of shift cycles are consecutive shift cycles, the third plurality of shift cycles are consecutive shift cycles, and the fourth plurality of shift cycles are consecutive shift cycles.

21. The structure of claim 18, wherein the first plurality of shift cycles is equal to the second plurality of shift cycles, and the third plurality of shift cycles is equal to the fourth plurality of shift cycles.

22. The structure of claim 1, wherein the compressed test response bits further include a third plurality of compressed test response bits, each generated in response to test response bits provided by a corresponding group of a third plurality of groups of the scan chains, the structure further comprising:
   a second shift-segment including a second multiple-input shift-register that receives and combines the third plurality of compressed test response bits received over a third plurality of shift cycles, thereby creating a third compacted test response vector.

23. The structure of claim 22, wherein the multiple-input shift-register of the shift-segment includes multiple loops and the second multiple-input shift-register of the second shift-segment includes one and only one loop.

24. The structure of claim 22, wherein the multiple-input shift-register of the shift-segment includes one and only one loop, and the second multiple-input shift-register of the second shift-segment includes one and only one loop.

25. The structure of claim 1, wherein the second plurality of groups of scan chains are mutually exclusive.

26. The structure of claim 1, wherein the second plurality of shift cycles are consecutive shift cycles.

27. A more efficient/useful electronic structure for circuit design, testing and/or manufacturing, comprising:
   a plurality of scan chains, each storing a corresponding plurality of test response bits, which are output over a corresponding plurality of shift cycles;
   a compactor that provides a plurality of compressed test response bits in response to the plurality of test response bits provided by the plurality of scan chains during each of the shift cycles, wherein each of the compressed test response bits is generated in response to test response bits provided by a mutually exclusive group of the scan chains; and
   a dual-segment register that includes:
   a first circular multiple-input shift-register that receives and combines a first subset of the plurality of compressed test response bits received over a first plurality of shift cycles; and
   a second circular multiple-input shift-register that receives and combines a second subset of the plurality of compressed test response bits received over the first plurality of shift cycles, wherein the first and second subsets are mutually exclusive.

28. The structure of claim 27, wherein the dual-segment register further includes:
   a third circular multiple-input shift-register that receives and combines a third subset of the plurality of compressed test response bits received over the first plurality of shift cycles, wherein the first, second and third subsets are mutually exclusive.

29. A method comprising:
   providing a plurality of test response bits from a corresponding plurality of scan chains over a plurality of shift cycles;
   providing compressed test response bits in response to the plurality of test response bits provided by the plurality of scan chains during each of the shift cycles,
   wherein the compressed test response bits include a first plurality of compressed test response bits, each generated in response to test response bits provided by a corresponding group of a first plurality of groups of the scan chains, and
   wherein the compressed test response bits include a second plurality of compressed test response bits, each generated in response to test response bits provided by a corresponding group of a second plurality of groups of the scan chains;
   receiving and combining the first plurality of compressed test response bits in a multiple-input shift-register over a first plurality of shift cycles, thereby creating a first compacted test response vector; and
   separately receiving and combining each of the second plurality of compressed test response bits in a corresponding single-input shift-register over a second plurality of shift cycles, thereby creating a second compacted test response vector.

30. The method of claim 29, further comprising providing the compressed test response bits with an array of exclusive OR gates.

31. The method of claim 29, further wherein the first plurality of groups of the scan chains is different than the second plurality of groups of the scan chains.

32. The method of claim 29, further comprising implementing a single feedback loop in the multiple-input shift-register.

33. The method of claim 29, further comprising implementing multiple feedback loops in the multiple-input shift-register.

34. The method of claim 29, further comprising serializing the first and second compacted test response vectors.

35. The method of claim 29, further comprising:
   providing the first compacted test response vector as an output once per test pattern of the test response bits; and
   providing the second compacted test response vector as an output multiple times per test pattern of the test response bits.

36. The method of claim 29, wherein the first plurality of shift cycles is greater than the second plurality of shift cycles.

37. The method of claim 29, wherein the first plurality of shift cycles is equal to the second plurality of shift cycles.

38. The method of claim 29, wherein the compressed test response bits further include a third plurality of compressed test response bits, each generated in response to test response bits provided by a corresponding group of a third plurality of groups of the scan chains, the method further comprising:

separately receiving and combining each of the third plurality of compressed test response bits in a corresponding single-input shift-register over a third plurality of shift cycles, thereby creating a third compacted test response vector.

39. The method of claim 38, wherein the first plurality of shift cycles is equal to the second plurality of shift cycles, and the third plurality of shift cycles is different than the first plurality of shift cycles and the second plurality of shift cycles.

40. The method of claim 38, wherein the second plurality of shift cycles is equal to the third plurality of shift cycles, and the first plurality of shift cycles is different than the second plurality of shift cycles and the third plurality of shift cycles.

41. The method of claim 38, wherein the second plurality of groups of scan chains are mutually exclusive, and the third plurality of groups of scan chains are mutually exclusive.

42. The method of claim 38, wherein the second plurality of shift cycles are consecutive shift cycles, and the third plurality of shift cycles are consecutive shift cycles.

43. The method of claim 38, wherein the compressed test response bits further include a fourth plurality of compressed test response bits, each generated in response to test response bits provided by a corresponding group of a fourth plurality of groups of the scan chains, the method further comprising:

separately receiving and combining each of the fourth plurality of compressed test response bits in a corresponding single-input shift-register over a fourth plurality of shift cycles, thereby creating a fourth compacted test response vector.

44. The method of claim 43, wherein the first plurality of shift cycles is equal to the second plurality of shift cycles, and the third plurality of shift cycles is equal to the fourth plurality of shift cycles.

45. The method of claim 43, wherein the second plurality of groups of scan chains are mutually exclusive, the third plurality of groups of scan chains are mutually exclusive, and the fourth plurality of groups of scan chains are mutually exclusive.

46. The method of claim 43, wherein the second plurality of shift cycles are consecutive shift cycles, the third plurality of shift cycles are consecutive shift cycles, and the fourth plurality of shift cycles are consecutive shift cycles.

47. The method of claim 29, wherein the compressed test response bits further include a third plurality of compressed test response bits, each generated in response to test response bits provided by a corresponding group of a third plurality of groups of the scan chains, the method further comprising:

receiving and combining the third plurality of compressed test response bits in a second multiple-input shift-register over a third plurality of shift cycles, thereby creating a third compacted test response vector.

48. The method of claim 47, wherein the multiple-input shift-register includes multiple loops and the second multiple-input shift-register includes one and only one loop.

49. The method of claim 47, wherein the multiple-input shift-register includes one and only one loop, and the second multiple-input shift-register includes one and only one loop.

50. The method of claim 29, wherein the second plurality of groups of scan chains are mutually exclusive.

51. The method of claim 29, wherein the second plurality of shift cycles are consecutive shift cycles.

* * * * *